United States Patent
Song et al.

(10) Patent No.: US 9,324,384 B2
(45) Date of Patent: Apr. 26, 2016

(54) SENSE AMPLIFIERS AND MEMORY DEVICES HAVING THE SAME

(71) Applicant: Samsung Electronics Co., Ltd., Suwon-Si, Gyeonggi-Do (KR)

(72) Inventors: Tae-Joong Song, Seongnam-si (KR); Sung-Hyun Park, Suwon-si (KR); Woo-Jin Rim, Seoul (KR); Gi-Young Yang, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/504,596

(22) Filed: Oct. 2, 2014

(65) Prior Publication Data
US 2015/0206556 A1    Jul. 23, 2015

(30) Foreign Application Priority Data
Jan. 17, 2014   (KR) .................. 10-2014-0005848

(51) Int. Cl.
| | |
|---|---|
| G11C 7/08 | (2006.01) |
| G11C 7/06 | (2006.01) |
| G11C 7/12 | (2006.01) |
| G11C 11/419 | (2006.01) |

(52) U.S. Cl.
CPC ........ *G11C 7/065* (2013.01); *G11C 7/12* (2013.01); *G11C 11/419* (2013.01)

(58) Field of Classification Search
CPC .................................. G11C 7/222; G11C 7/08
USPC .............................................. 365/189.05, 205
See application file for complete search history.

(56) References Cited

U.S. PATENT DOCUMENTS

| | | | | |
|---|---|---|---|---|
| 4,355,377 | A * | 10/1982 | Sud ....................... | G11C 11/419 326/98 |
| 5,657,290 | A * | 8/1997 | Churcher ............... | G11C 7/062 365/156 |
| 5,949,256 | A | 9/1999 | Zhang et al. | |
| 5,963,484 | A | 10/1999 | Jung | |
| 6,952,363 | B2 | 10/2005 | Song et al. | |
| 8,179,735 | B2 | 5/2012 | Wu | |
| 8,208,331 | B2 | 6/2012 | Lin et al. | |
| 8,437,210 | B2 | 5/2013 | Wu et al. | |
| 8,614,925 | B2 | 12/2013 | Park et al. | |
| 8,848,419 | B2 * | 9/2014 | Wu ....................... | G11C 11/419 365/148 |
| 2007/0016826 | A1 * | 1/2007 | Dubey ................. | G11C 29/003 714/30 |
| 2007/0109893 | A1 * | 5/2007 | Wood .................. | G11C 11/4125 365/208 |

(Continued)

FOREIGN PATENT DOCUMENTS

| | | |
|---|---|---|
| KR | 2001-0047533 A | 6/2001 |
| KR | 1224259 A | 7/2012 |

*Primary Examiner* — Michael Tran
(74) *Attorney, Agent, or Firm* — Harness, Dickey & Pierce, P.L.C.

(57) ABSTRACT

In a sense amplifier, a switching transistor is configured to apply a ground voltage to a ground node in response to a sense enable signal. A first detection circuit is configured to output a first detection signal to the first detection node based on a mode signal and a voltage of a bit-line. A second detection circuit is configured to output a second detection signal to the second detection node based on a voltage of a complementary bit-line. A latch circuit is connected to a supply voltage, the first detection node and the second detection node, and configured to output a first amplified signal and a second amplified signal through a latch node and a complementary latch node, respectively, based on the first detection signal and the second detection signal.

16 Claims, 17 Drawing Sheets

(56) References Cited

U.S. PATENT DOCUMENTS

| | | |
|---|---|---|
| 2010/0002528 A1 | 1/2010 | Okawa |
| 2013/0148452 A1 | 6/2013 | Schreiber |
| 2013/0155798 A1 | 6/2013 | Kajigaya |
| 2014/0126315 A1* | 5/2014 | Roy .................... G11C 11/419 365/207 |

* cited by examiner

SENSE AMPLIFIERS AND MEMORY DEVICES HAVING THE SAME

CROSS-REFERENCE TO RELATED APPLICATION(S)

This application claims priority under 35 USC §119 to Korean Patent Application No. 10-2014-0005848, filed on Jan. 17, 2014 in the Korean intellectual Property Office (KIPO), the contents of which are herein, incorporated by reference in their entirety.

BACKGROUND

1. Technical Field

Example embodiments relate to semiconductor devices, and more particularly to sense amplifiers and/or memory devices having sense amplifiers.

2. Description of the Related Art

Memory cells included in a conventional static random access memory (SRAM) device may have various different structures. For example, memory cells of an SRAM may be divided into a double-ended read memory cell and a single-ended read memory cell. In a double-ended read memory cell, differential signals corresponding to stored data are provided through a bit-line and a complementary bit-line in a read mode. In a single-ended read memory cell, a signal corresponding to stored data is provided through only a bit-line in a read mode.

Since a read operation in the double-ended read memory cell is different from a read operation in the single-ended read memory cell, a sense amplifier for the double-ended read memory cell has a different structure from a sense amplifier for the single-ended read memory cell.

Conventionally, a new process of manufacturing memory devices must be tested. Therefore, a sense amplifier for a double-ended read memory cell and a sense amplifier for a single-ended read memory cell are designed separately to test a SRAM device including double-ended read memory cells and a SRAM device including single-ended read memory cells.

SUMMARY

At least some example embodiments provide sense amplifiers able to perform both double-ended read operations and single-ended read operations.

At least some example embodiments provide memory devices including sense amplifiers.

According to at least one example embodiment, a sense amplifier includes: a switching (e.g., n-type metal oxide semiconductor (NMOS)) transistor; a first detection circuit; a second detection circuit; and a latch circuit. The switching transistor is configured to apply as ground voltage to a ground node in response to a sense enable signal. The first detection circuit is coupled between the ground node and as first detection node, and configured to provide, a first detection signal to the first detection node based on a mode signal and a voltage, of a bit-line. The second detection circuit is coupled between the ground node and a second detection node, and configured to provide a second detection signal to the second detection node based on a voltage of a complementary bit-line. The latch circuit is connected to a supply voltage, the first detection node and the second detection node, and configured to output a first amplified signal and a second amplified signal through as latch node and as complementary latch node, respectively, based on the first detection signal and the second detection signal.

In example embodiments, the first detection circuit may include is mode control (e.g., NMOS) transistor and at least one first transistor. The mode control transistor may be coupled between the ground node and the first detection node, and have as gate configured to receive the mode signal. The at least one first (e.g., NMOS) transistor may be coupled between the ground node and the first detection node, and have a gate connected to the bit-line. The second detection circuit may include a balance (e.g., NMOS) transistor and at least one second (e.g. NMOS) transistor. The balance transistor may be coupled between the ground node and the second detection node, and have a gate configured to receive the ground voltage. The at least one second transistor may be coupled between the ground node and the second detection node, and have a gate connected to the complementary bit-line.

A current driving capability of the mode control transistor may be the same or substantially the same as a current driving capability of the balance transistor. A sum of a current driving capability of the at least one first transistors may be the same or substantially the same as a sum of a current driving capability of the at least one second transistors.

A number of the at least one first transistors may be the same as a number of the at least one second transistors.

In example embodiments, the mode signal may have a first logic (e.g., logic low) level in a double-ended read mode, and have, a second logic (e.g., logic high) level in a single-ended read mode. The first and second logic levels may be different.

In the double-ended read mode, the first detection circuit may be configured to receive a bit-line signal through the bit-line, and the second detection circuit may be configured to receive a complementary bit-line signal through the complementary bit-line. In the single-ended read mode, the first detection circuit may be configured to receive the bit-line signal through the bit-line, and the second detection circuit may be configured to receive, the supply voltage through the complementary bit-line.

In example embodiments, the latch circuit may include: a first latch (e.g., p-type metal oxide semiconductor (PMOS)) transistor coupled between the supply voltage and the latch node, and having a gate connected to the complementary latch node; a second latch (e.g., PMOS) transistor coupled between the supply voltage and the complementary latch node, and having a gate connected to the latch node; a third latch (e.g. NMOS) transistor coupled between the latch node and the first detection node, and having a gate connected to the complementary latch node; and a fourth latch (e.g., NMOS) transistor coupled between the complementary latch node and the second detection node, and having a gate connected to the latch node.

In example embodiments, the sense amplifier may further include a reset circuit configured to reset a voltage of the latch node and a voltage of the complementary latch node to the supply voltage in response to the sense enable signal.

The reset circuit may include: a first reset ((e.g., PMOS) transistor coupled between the supply voltage and the latch node, and having the gate configured to receive the sense enable signal; a second reset (e.g., PMOS) transistor coupled between the supply voltage and the complementary latch node, and having a gate configured to receive the sense enable signal; and a third reset PMOS) transistor coupled between the latch node and the complementary latch node, and having a gate configured to receive the sense enable signal.

In example embodiments, the sense amplifier may further include a precharge circuit configured to precharge the bit-line and the complementary bit-line to the supply voltage in response to a first precharge signal and a second precharge.

The precharge circuit may include: as first precharge (e.g., PMOS) transistor coupled between the supply voltage and the bit-line, and having a gate configured to receive the first precharge signal; a second precharge PMOS) transistor coupled between the supply voltage and the complementary bit-line, and having a gate configured to receive the second precharge signal; and a third precharge (e.g., PMOS) transistor coupled between the bit-line and the complementary bit-line, and having a gate configured to receive the first precharge signal.

The first precharge signal and the second precharge signal may have the same logic level as the sense enable signal when the mode signal has a first logic (e.g., logic low) level. The first precharge signal may have the same logic level as the sense enable signal and the second precharge signal may be maintained at the first logic level when the mode signal has a second logic (e.g., logic high) level.

In example embodiments, the sense amplifier may further include: a first inverter con figured to invert the first amplified signal a first (e.g., NMOS) transistor coupled between a global bit-line and the ground voltage, and having, a gate connected to an output electrode of the first inverter; a second inverter configured to invert the second amplified signal; and a second (e.g., NMOS) transistor coupled between a global complementary bit-line and the ground voltage, and having a gate connected to an output electrode of the second inverter.

According to example embodiments, a memory device includes: a memory cell array; a plurality of sense amplifiers; and a control circuit. The memory cell array includes a plurality of memory cells arranged in rows and columns. The plurality of memory cells are connected to a plurality of word-lines, a plurality of bit-lines and a plurality of complementary bit-lines. Each of the plurality of sense amplifiers is coupled to a corresponding column of the memory cell array through a corresponding bit-line and a corresponding complementary bit-line. Each of the sense amplifiers is configured to generate a first amplified signal and a second amplified signal based on as mode signal voltage of the corresponding bit-line and a voltage of the corresponding complementary bit-line. The control circuit is configured to generate the mode signal based on whether the plurality of memory cells perform a double-ended read operation or a single-ended read operation. Each of the plurality of sense amplifiers includes: a switching (e.g., NMOS) transistor; a first detection circuit; a second detection circuit; and a latch circuit. The switching transistor is configured to apply a ground voltage to a ground node in response to a sense enable signal. The first detection circuit is coupled between the ground node and a first detection node, and configured to provide a first detection signal to the first detection node based on the mode signal and the voltage of the corresponding bit-line. The second detection circuit is coupled between the ground node and a second detection node, and configured to provide a second detection signal to the second detection node based on the voltage of the corresponding complementary bit-line. The latch circuit is connected to a supply voltage, the first detection node and the second detection node, and configured to output the first amplified signal and the second amplified signal through a latch node and a complementary latch node, respectively, based on the first detection signal and the second detection signal.

In accordance with example embodiments, a memory device includes: a memory cell; and a sense amplifier coupled to the memory cell. The sense amplifier is configured to perform a single-ended read operation for the memory cell in a single-ended read mode, and to perform a double-ended read operation for the memory cell in a double-ended read mode.

The sense amplifier may be configured to operate in the single-ended read mode or the double-ended read mode based on a mode signal from a control circuit.

The sense amplifier may be configured to have one of a symmetric and asymmetric structure based on a read, mode for the memory cell, the read mode being one of the double-ended read mode and the single-ended read mode.

The sense amplifier may have the symmetric structure when configured to operate in the double-ended read mode, and the sense amplifier may have the asymmetric structure when configured to operate in the single-ended read mode.

The memory cell may be coupled to a bit-line and a complementary bit line. The sense amplifier may include: a first detection circuit configured to generate a first detection signal based on the mode signal and a voltage on the bit-line; a second detection circuit configured to generate a second detection signal based on a voltage on the complementary bit-line; and a latch circuit configured to output a first amplified signal and a second amplified signal based on the first and second detection signals. The first detection circuit and the second detection circuit may be configured to have one of a symmetric and asymmetric structure relative to one another based on a read mode for the memory cell, the read mode being one of the double-ended read mode and the single-ended read mode.

BRIEF DESCRIPTION OF THE DRAWINGS

Illustrative, non-limiting example embodiments will be more clearly understood from the following detailed description in conjunction with the accompanying drawings.

DETAILED DESCRIPTION

Figure 1:
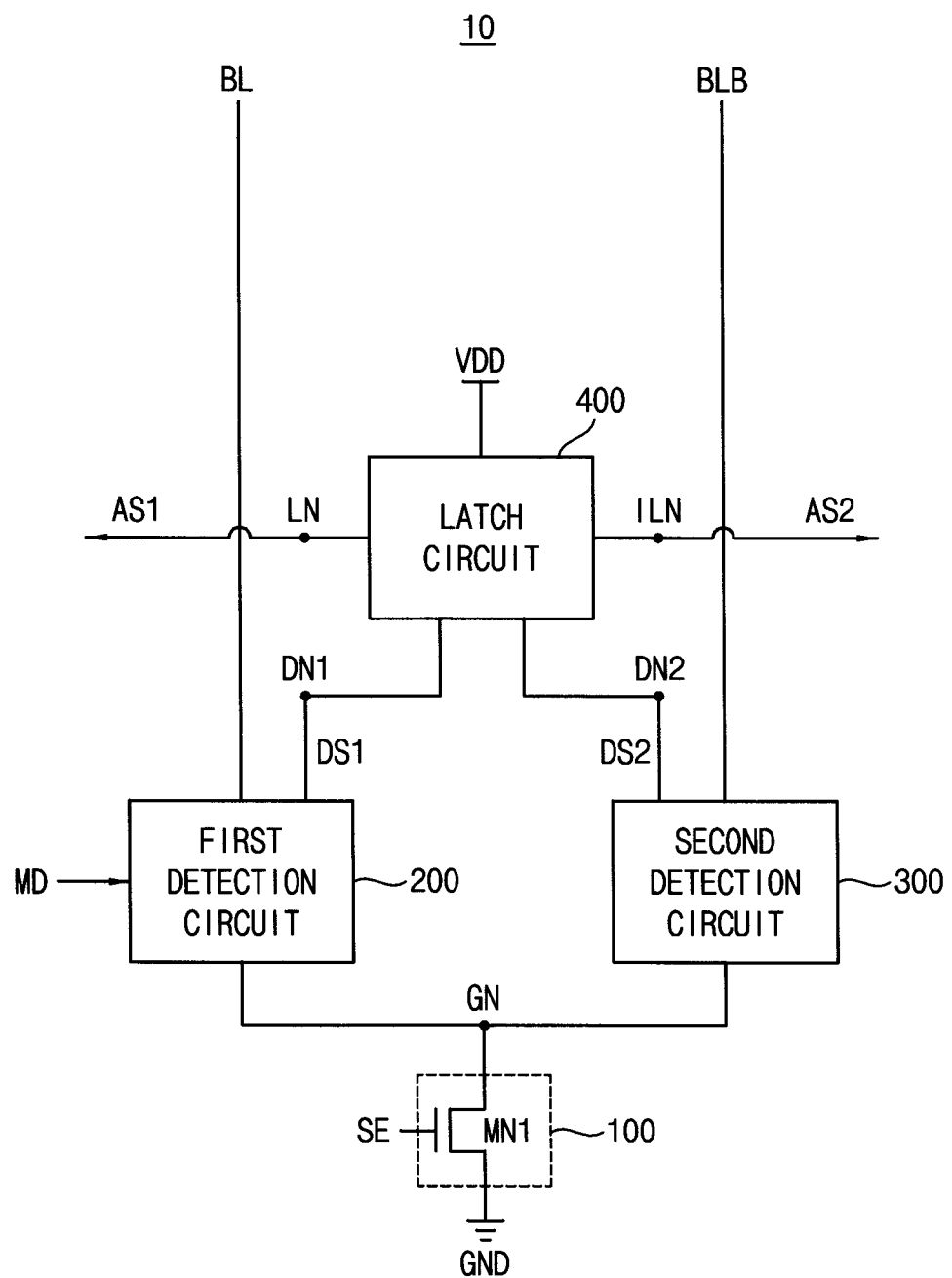
FIG. 1 is a block diagram illustrating a sense amplifier according to example embodiments.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As discussed herein, example embodiments of sense amplifiers and/or one or more components thereof may be hardware, firmware, hardware executing software or any combination thereof. When the sense amplifiers and/or one or more components thereof are hardware, such hardware may include one or more. Central Processing circuits (CPUs), system-on-chips (SOCs), digital signal processors (DSPs), application-specific-integrated-circuits (ASICs), field programmable gate arrays (FPGAs) computers or the like configured as special purpose machines to perform the functions of the sense amplifiers, CPUs, SOCs, DSPs, ASICs and FPGAs may sometimes generally be referred to as processors and/or microprocessors.

Although example embodiments may be discussed with regard to configurations including n-type metal oxide semiconductor (NMOS) transistors and p-type metal oxide semiconductor (PMOS) transistors, example embodiments should not be limited to these examples. According to example embodiments, sense amplifiers and/or components thereof may be implemented using other types of transistors. Moreover, one of ordinary skill in the art would understand that NMOS transistors may be rep/aced with PMOS transistors and PMOS transistors may be replaced with NMOS transistors in alternative example embodiments.

FIG. 1 is a block diagram illustrating, a sense amplifier according to example embodiments.

Referring to FIG. 1, a sense amplifier 10 includes; a switching circuit 100; a first detection circuit 200; a second detection circuit 300; and a latch circuit 400.

The switching circuit 100 may include a switching n-type metal oxide semiconductor (NMOS) transistor MN1. The switching NMOS transistor MN1 applies a ground voltage GND to a ground node GN in response to a sense enable signal SE. The switching NMOS transistor MN1 may be turned off to float the ground node GN when the sense enable signal SE has a logic low level. The switching NMOS transistor MN1 may be turned on to apply the ground voltage GND to the ground node GN when the sense enable signal SE has a logic high level.

The first detection circuit 200 is coupled between the ground node GN and a first detection node DN1. The first detection circuit 200 provides a first detection signal DS1 to the first detection node DN1 based on a mode signal MD and a voltage of a bit-line BL. The mode signal MD may represent one of a double-ended read mode and a single-ended read mode.

The second detection circuit 300 is coupled between the ground node GN and a second detection node DN2. The second detection circuit 300 provides a second detection signal DS2 to the second detection node DN2 based on a voltage of as complementary bit-line BLB.

For example, the first detection circuit 200 and the second detection circuit 300 may detect the voltage of the bit-line BL and the voltage, of the complementary BLB to provide the first detection signal DS1 and the second detection signal DS2 to the first detection node DN1 and the second detection node DN2, respectively.

The latch circuit 400 is connected to as supply voltage VDD, the first detection node DN1 and the second detection node DN2. The latch circuit 400 outputs a first amplified signal AS1 and a second amplified signal AS2 through a latch node LN and as complementary latch node ILN, respectively, based on the first detection signal DS1 and the second detection signal DS2.

In at least some example embodiments, the latch circuit 400 may generate the first amplified signal AS1 and the second amplified signal AS2 by amplifying a difference between the first detection signal DS1 and the second detection signal DS2. For example, the latch circuit 400 may generate the first amplified signal AS1 having the logic low level and the second amplified signal AS2 having the logic high level when a voltage of the first detection signal DS1 is lower than a voltage of the second detection signal DS2, and generate the first amplified signal AS1 having the logic high level and the second amplified signal AS2 having the logic low level when a voltage of the second detection signal DS2 is lower than a voltage of the first detection signal DS1.

Figure 2:
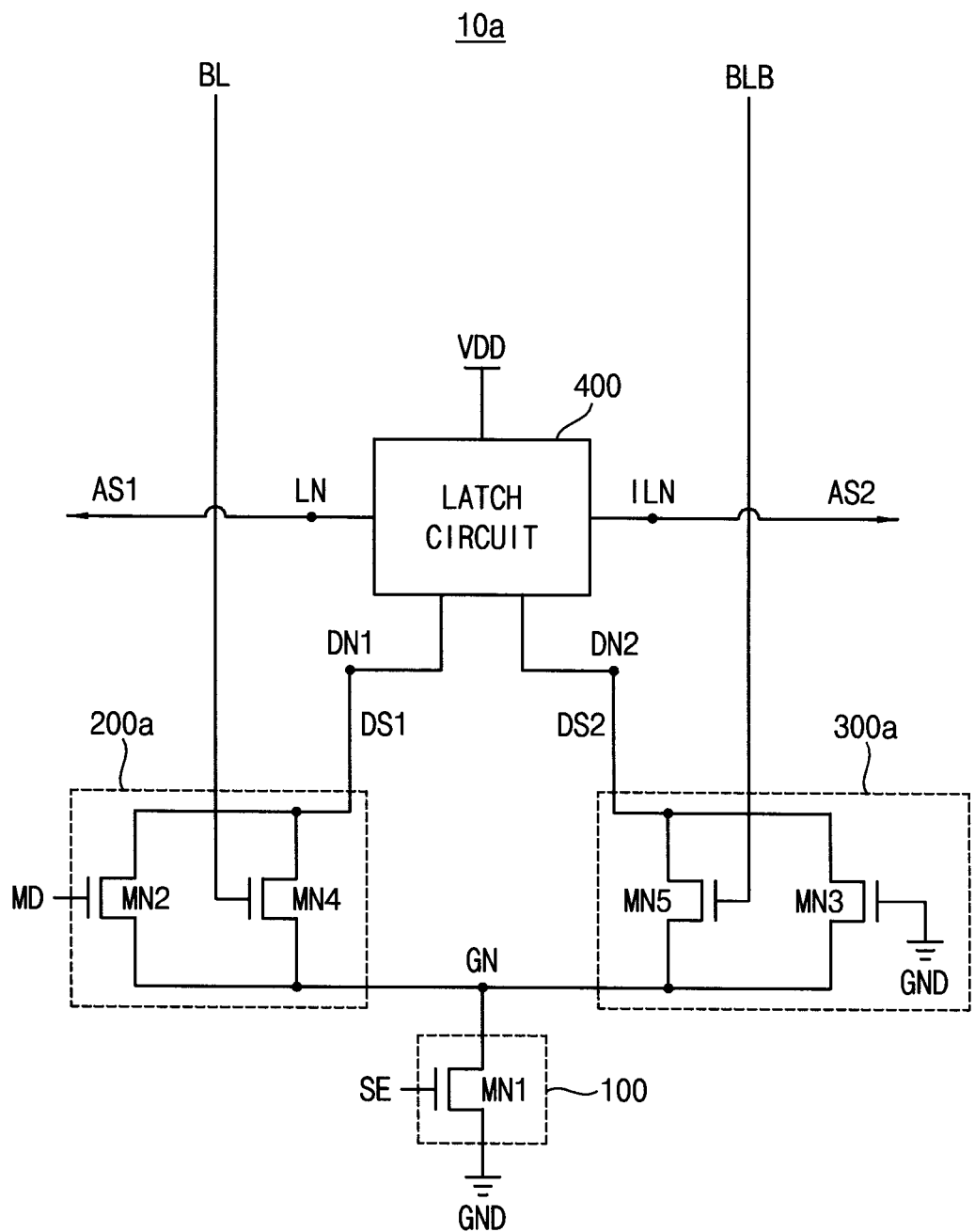
FIGS. 2 and 3 are circuit diagrams illustrating examples of a first detection circuit and a second detection circuit included in a sense amplifier of FIG. 1.
Figure 3:
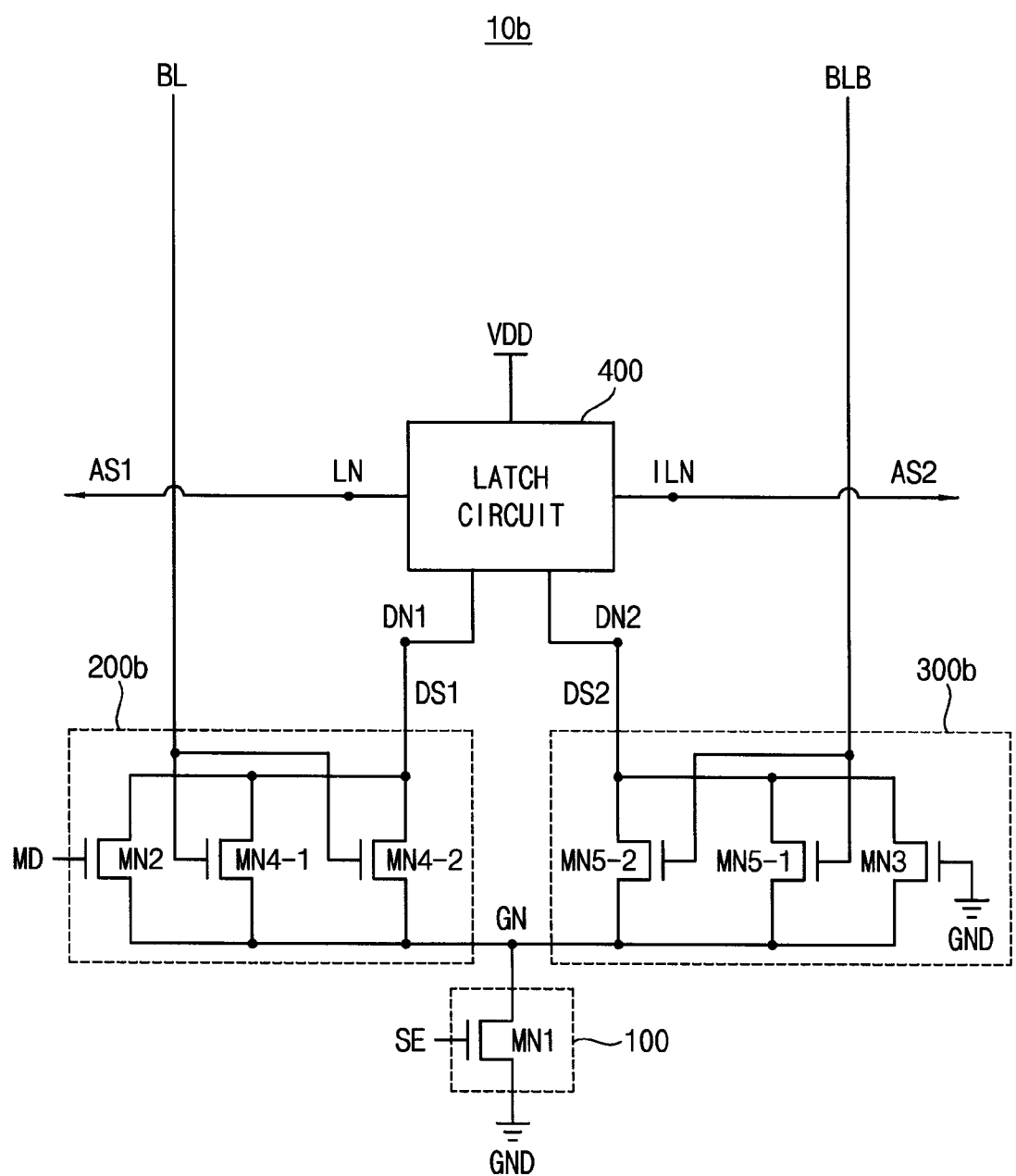

FIGS. 2 and 3 are circuit diagrams illustrating examples of a first detection circuit and a second detection circuit included in a sense amplifier of FIG. 1.

Referring to FIG. 2, a sense amplifier 10a may include; the switching circuit 100; a first detection circuit 200a; a second detection circuit 300a; and the latch circuit 400.

The first detection circuit 200a included in the sense amplifier 10a may include a mode control NMOS transistor MN2 and a first NMOS transistor MN4.

The mode control NMOS transistor MN2 may be coupled between the ground node GN and the first detection node DN1. The mode control NMOS transistor MN2 may include a gate receiving the mode signal MD.

The first NMOS transistor MN4 may be coupled between the ground node GN and the first detection node DN1. The first NMOS transistor MN4 may include a gate connected to the bit-line BL.

The second detection circuit 300a included in the sense amplifier 10a may include a balance NMOS transistor MN3 and a second NMOS transistor MN5.

The balance NMOS transistor MN3 may be coupled between the ground node GN and the second detection node DN2. The balance NMOS transistor MN3 may include a gate receiving the ground voltage GND.

The second NMOS transistor MN5 may be coupled between the ground node GN and the second detection node DN2. The second NMOS transistor MN5 may include a gate connected to the complementary bit-line BLB.

Referring to FIG. 3, a sense amplifier 10b may include: the switching circuit 100; a first detection circuit 200b; a second, detection circuit 300b; and the latch circuit 400.

The first detection circuit 200b included in the sense amplifier 10b may include a mode control NMOS transistor MN2 and at least one first NMOS transistor MN4-1 and MN4-2.

The mode control NMOS transistor MN2 may be coupled between the ground node GN and the first detection node DN1. The mode control NMOS transistor MN2 may include a gate receiving the mode signal MD.

The at least one first NMOS transistor MN4-1 and MN4-2 may be coupled between the ground node GN and the first detection node DN1 in parallel. The at least one first NMOS transistor MN4-1 and MN4-2 may include a gate connected to the bit-line BL.

The second detection circuit 300b included in the sense amplifier 10b may include a balance NMOS transistor MN3 and at least one second NMOS transistor MN5-1 and MN5-2.

The balance NMOS transistor MN3 may be coupled between the ground node GN and the second detection node DN2. The balance NMOS transistor MN3 may include a gate receiving the ground voltage GND.

The at least one second NMOS transistor MN5-1 and MN5-2 may be coupled between the ground node GN and the second detection node DN2 in parallel. The at least one second NMOS transistor MN5-1 and MN5-2 may include a gate connected to the complementary bit-line BLB.

As an example, the first detection circuit 200a is illustrated to include one first NMOS transistor MN4 and the second detection circuit 300a is illustrated to include one second NMOS transistor MN5 in FIG. 2, and the first detection circuit 200b is illustrated to include two first NMOS transistors MN4-1 and MN4-2 and the second detection circuit 300b is illustrated to include two second NMOS transistors MN5-1 and MN5-2 in FIG. 3. However, example embodiments are not limited thereto. According to example embodiments, the first detection circuit 200b may include more than two first NMOS transistors MN4 and the second detection circuit 300b may include, more than two second NMOS transistors MN5.

In some example embodiments, a current driving capability of the mode control NMOS transistor MN2 may be the same or substantially the same as a current driving capability of the balance NMOS transistor MN3. For example, an aspect ratio W/L of the mode control NMOS transistor MN2 may be the same or substantially the same as an aspect ratio W/L of the balance NMOS transistor MN3.

In some example embodiments, a sum of a current driving capability of the at least one first NMOS transistor MN4 included in the first detection circuit 200b may be the sari or substantially the same as a sum of a current driving capability of the at least one second NMOS transistor MN5 included in the second detection circuit 300b.

For example, when the first detection circuit 200a includes one first NMOS transistor MN4 and the second detection circuit 300a includes one second NMOS transistor MN5 as illustrated in FIG. 2, an aspect ratio W/L of the first NMOS transistor MN4 may the same or substantially the same as an aspect ratio W/L of the second NMOS transistor MN5.

For example, when the first detection circuit 200b includes two or more first NMOS transistors MN4-1 and MN4-2 and the second detection circuit 300b includes two or more second NMOS transistors MN5-1 and MN5-2 as illustrated in FIG. 3 and an aspect ratio W/L of the two or more first NMOS transistors MN4-1 and MN4-2 is the same or substantially the same as an aspect ratio W/L of the two or more second NMOS transistors MN5-1 and MN5-2, a number of the two or more first NMOS transistors MN4-1 and MN4-2 may be the same or substantially the same as a number of the two or more second NMOS transistors MN5-1 and MN5-2.

In some example embodiments, if the first detection circuit 200a includes one first NMOS transistor MN4 and the second detection circuit 300a includes one second NMOS transistor MN5 as illustrated in FIG. 2, the current driving capability of the mode control NMOS transistor MN2 may be smaller than the current driving ability of the second NMOS transistor MN5.

In some example embodiments, if the first detection circuit 200a includes two or more first NMOS transistors MN4-1 and MN4-2 and the second detection circuit 300b includes two or more second NMOS transistors MN5-1 and MN5-2 as illustrated in FIG. 3, current driving capabilities of the mode control NMOS transistor MN2, then the balance NMOS transistor MN3, the two or more first NMOS transistor MN4-1 and MN4-2 and the two or more second NMOS transistor MN5-1 and MN5-2 may be the same or substantially the same as each other.

As will be described later with reference to FIGS. 8 to 11, the mode signal MD may have the logic low level in the double-ended read mode, in which a bit-line signal BLS may be provided to the first detection circuit 200b through the bit-line BL and a complementary bit-line signal BLBS may be provided to the second detection circuit 300b through the complementary bit-line BLB, and have the logic high level in the single-ended read mode, in which the bit-line signal BLS may be provided to the first detection circuit 200b through the bit-line BL and the supply voltage VDD may be provided to the second detection circuit 300b through the complementary bit-line BLB.

As described above, the balance NMOS transistor MN3 may be maintained to be turned off since the ground voltage GND is provided to the gate of the balance NMOS transistor MN3. Therefore, in the double-ended read mode, the mode signal MD may have the logic low level to turn off the mode control NMOS transistor MN2 such that the first detection circuit 200b and the second detection circuit 300b may have a symmetric structure with each other. On the other hand, in the single-ended read mode, the mode signal MD may have the logic high level to turn on the mode control NMOS transistor MN2 such that the first detection circuit 200b and the second detection circuit 300b may have an asymmetric structure with each other.

Figure 4:
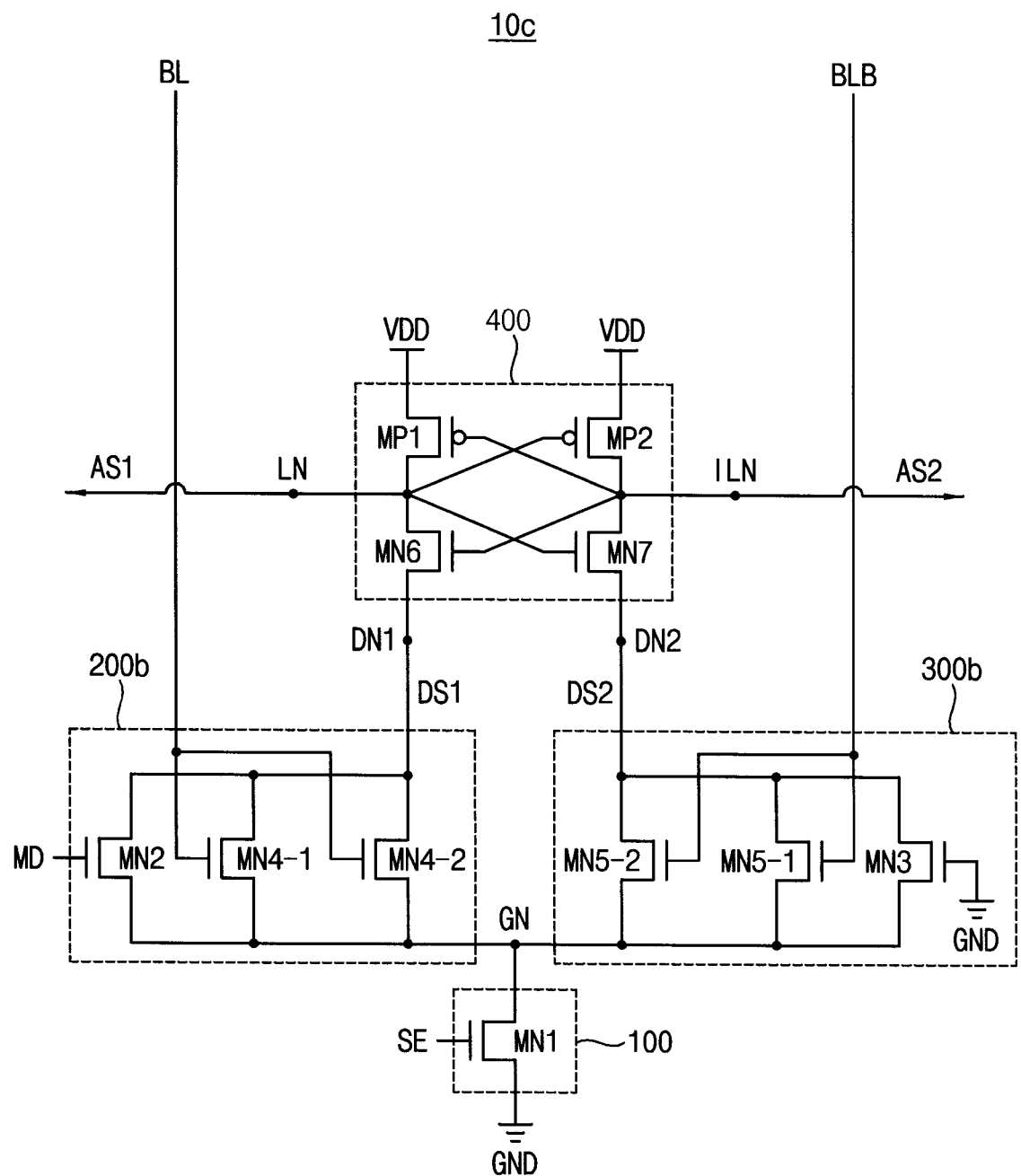
FIG. 4 is a circuit diagram illustrating an example of a latch circuit included in a sense amplifier of FIG.

FIG. 4 is a circuit diagram illustrating an example of a latch circuit included in a sense amplifier of FIG. 1.

Referring to FIG. 4, a sense amplifier 10c may include: the switching circuit 100; the first detection circuit 200b; the second detection circuit 300b; and the latch circuit 400.

The latch circuit 400 included in the sense amplifier 10c may include: a first p-type metal oxide semiconductor (PMOS) transistor MP1; a second PMOS transistor MP2; a third NMOS transistor MN6; and as fourth NMOS transistor MN7. The transistors of the latch circuit 400 may also be referred to as latch transistors.

The first PMOS transistor MP1 may be coupled between the supply voltage VDD and the latch node LN. The first PMOS transistor MP1 may include a gate connected to the complementary latch node ILN.

The second PMOS transistor MP2 may be coupled between the supply voltage VDD and the complementary latch node ILN. The second PMOS transistor MP2 may include a gate connected to the latch node LN.

The third NMOS transistor MN6 may be coupled between the latch node LN and the first detection node DN1. The third NMOS transistor MN6 may include a gate connected to the complementary latch node ILN.

The fourth NMOS transistor MN7 may be coupled between the complementary latch node ILN and the second detection node DN2. The fourth NMOS transistor MN7 may include a gate connected to the latch node LN.

As will be described later with reference to FIG. 5, the larch node LN and the complementary latch node ILN may be reset to the supply voltage VDD at an initial stage.

Therefore, when the voltage of the first detection signal DS1 is lower than the voltage of the second detection signal DS2, the third NMOS transistor MN6 may be turned on to a greater extent (e.g., more strongly) than the fourth NMOS transistor MN7. As such, the latch circuit 400 may output the first amplified signal AS1 having the logic low level through the latch node LN and output the second amplified signal AS2 having the logic high level through the complementary latch node ILN.

Alternatively, when the voltage of the second detection signal DS2 is lower than the voltage of the first detection signal DS1, the fourth NMOS transistor MN7 may be turned on to at greater extent (e.g., more strongly) than the third NMOS transistor MN6. As such, the latch circuit 400 may output the first amplified signal AS1 having the logic high level through the latch node LN and output the second amplified signal AS2 having the logic low level through the complementary latch node ILN.

Therefore, the latch circuit 400 may generate the first amplified signal AS1 and the second amplified signal AS2 by amplifying a difference between the first detection signal DS1 and the second detection signal DS2.

Figure 5:
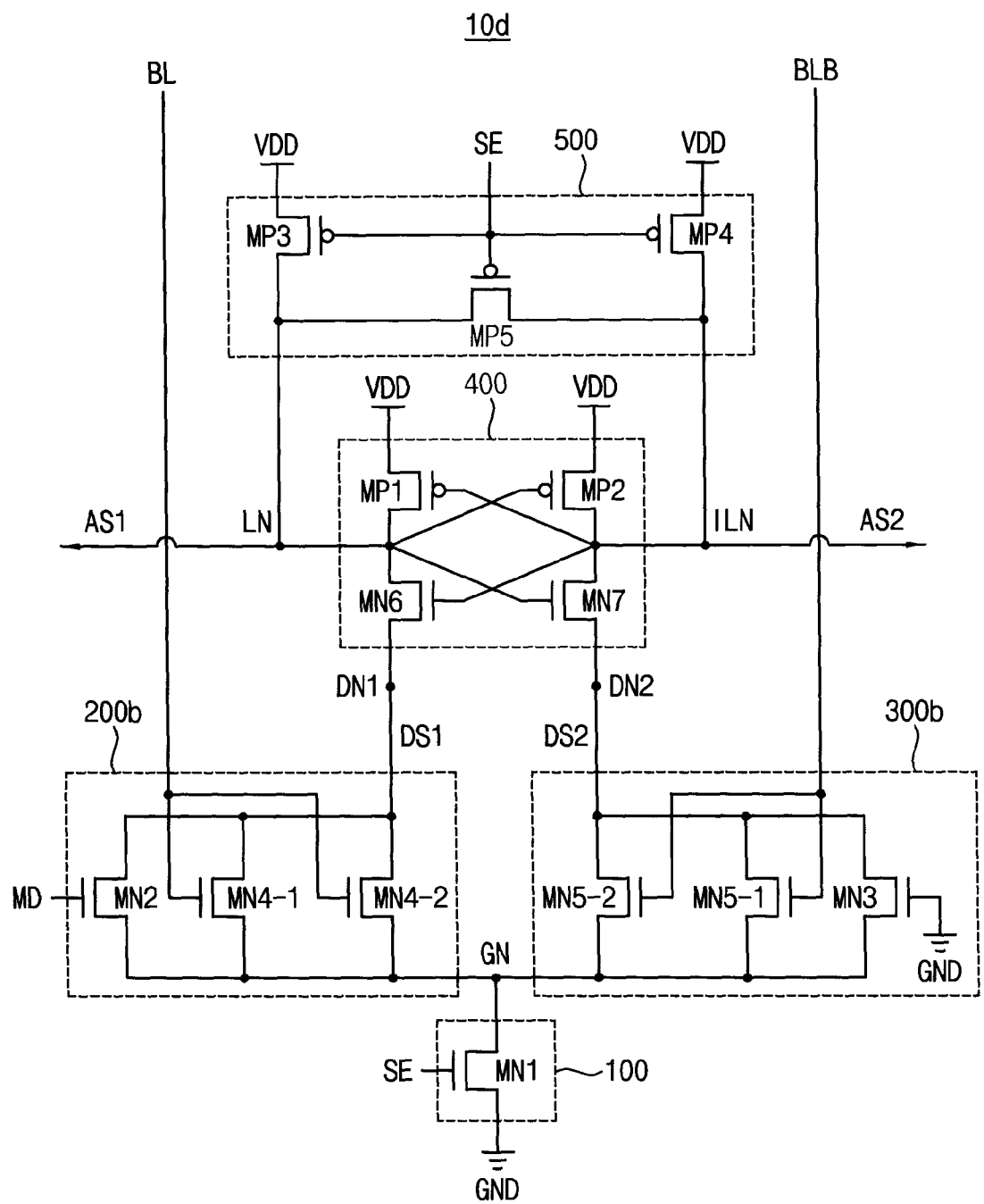
FIG. 5 is a circuit diagram illustrating another sense amplifier according to example embodiments.

FIG. 5 is a circuit diagram illustrating another sense amplifier according to example embodiments.

The sense amplifier 10d of FIG. 5 is similar to the sense amplifier 10c in FIG. 4, but further includes a reset circuit 500.

The reset circuit 500 may reset a voltage of the latch node LN and a voltage of the complementary latch node ILN to the supply voltage VDD in response to the sense enable signal SE.

Referring to FIG. 5, the reset circuit 500 may include: a third PMOS transistor MP3 a fourth PMOS transistor MP4; and a fifth PMOS transistor MP5. The transistors of the reset circuit 500 may also be referred to as reset transistors.

The third PMOS transistor MP3 may be coupled between the supply voltage VDD and the latch node LN. The third PMOS transistor MP3 may include a gate receiving the sense enable signal SE.

The fourth PMOS transistor MP4 may be coupled between the supply voltage VDD and the complementary latch node ILN. The fourth PMOS transistor MP4 may include a gate receiving the sense enable signal SE.

The fifth PMOS transistor MP5 may be coupled between the latch node LN and the complementary latch node ILN. The fifth PMOS transistor MP5 may include a gate receiving the sense enable signal SE.

Therefore, when the sense enable signal SE has the logic low level, the switching NMOS transistor MN1 may be turned off to float the ground node GN, and the third PMOS transistor MP3, the fourth PMOS transistor MP4 and the fifth PMOS transistor MP5 included in the reset circuit 500 may be turned on to reset the voltage of the latch node LN and the voltage of the complementary latch node ILN to the supply voltage VDD.

On the other hand, when the sense enable signal SE has the logic high level, the switching NMOS transistor MN1 may be turned on, and the third PMOS transistor MP3, the fourth PMOS transistor MP4 and the fifth PMOS transistor MP5 included in the reset circuit 500 may be turned off such that the sense amplifier 10d may output the first amplified signal AS1 and the second amplified signal AS2 through the latch node LN and the complementary latch node ILN, respectively, based on the voltage of the latch node LN and the voltage of the complementary latch node ILN.

Figure 6:
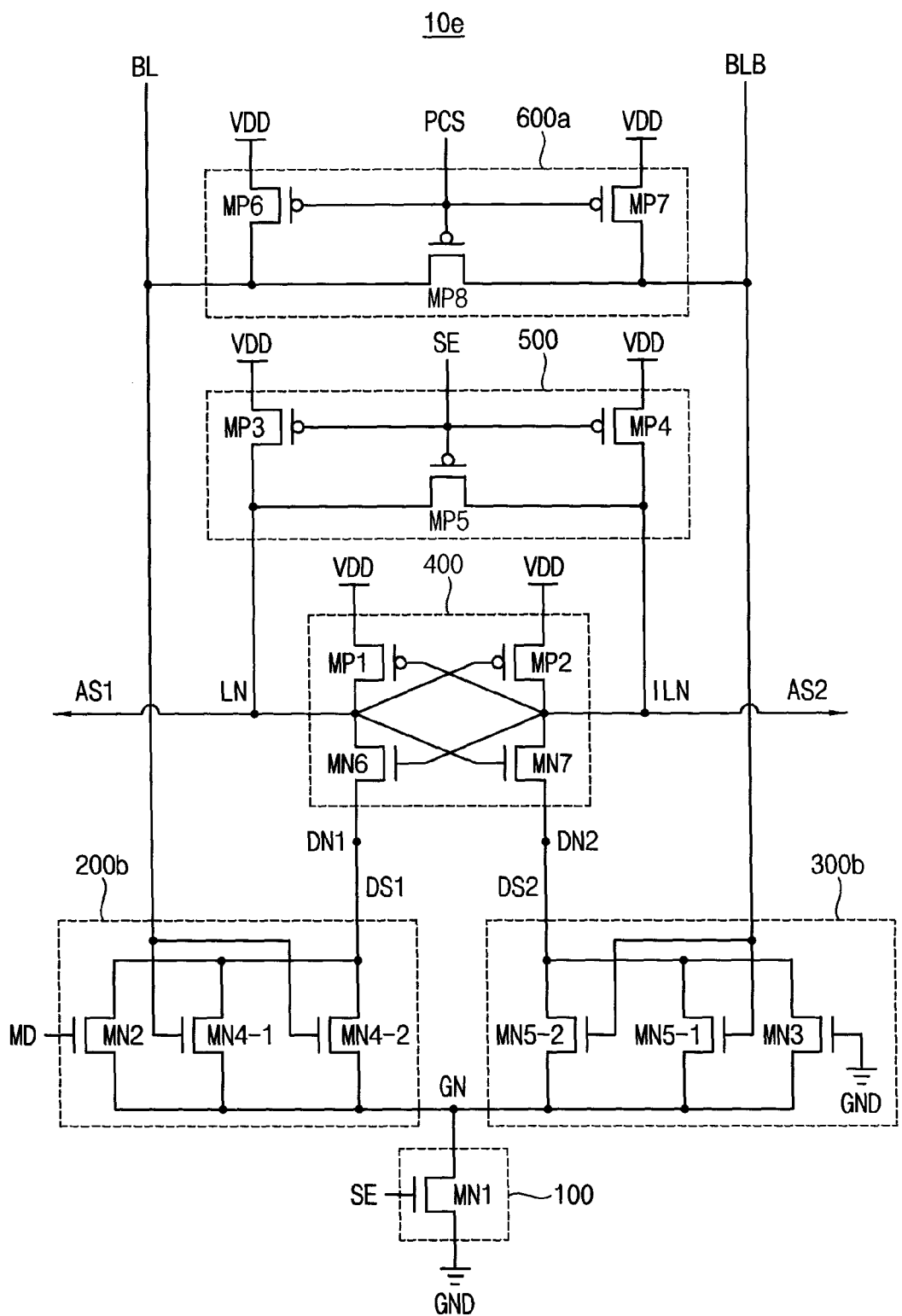
FIG. 6 is a circuit diagram illustrating another sense amplifier according to example embodiments.

FIG. 6 is a circuit diagram illustrating another sense amplifier according to example embodiments.

The sense amplifier 10e in FIG. 6 is similar to the sense amplifier 10d in FIG. 5, but further includes a precharge circuit 600a.

The precharge circuit 600a may precharge the bit-line BL and the complementary bit-line BLB to the supply voltage VDD in response to a precharge signal PCS.

Referring to FIG. 6, the precharge circuit 600a may include: a sixth PMOS transistor MP6; as seventh PMOS transistor MP7; and an eighth PMOS transistor MP8. The transistors of the precharge circuit 600a may also be referred to as precharge transistors.

The sixth PMOS transistor MP6 may be coupled between the supply voltage VDD and the bit-line BL. The sixth PMOS transistor MP6 may include a gate receiving the precharge signal PCS.

The seventh PMOS transistor MP7 may be coupled between the supply voltage VDD and the complementary bit-line BLB. The seventh PMOS transistor MP7 may include a gate receiving the precharge signal PCS.

The eighth PMOS transistor MP8 may be coupled between the bit-line BL and the complementary bit-line BLB. The eighth PMOS transistor MP8 may include a gate receiving the precharge signal PCS.

In some example embodiments, the precharge signal PCS may have the same logic level as the sense enable signal SE.

Therefore, while the sense enable signal SE has the logic low level to turn off the switching NMOS transistor MN1, the precharge signal PCS may have the logic low level to turn on the sixth PMOS transistor MP6, the seventh PMOS transistor MP7 and the eighth PMOS transistor MP8 included in the precharge circuit 600a such that the bit-line BL and the complementary bit-line BLB may be precharged to the supply voltage VDD.

On the other hand, while, the sense enable signal SE has the logic high level to turn on the switching NMOS transistor NM1, the precharge signal PCS may have the logic high level to turn off the sixth PMOS transistor MP6, the seventh PMOS transistor MP7 and the eighth PMOS transistor MP8 included in the precharge circuit 600a. Therefore, the voltage of the bit-line BL and the voltage of the complementary bit-line BLB may be changed used on data stored in a memory cell coupled to the bit-line BL and the complementary bit-line BLB.

Figure 7:
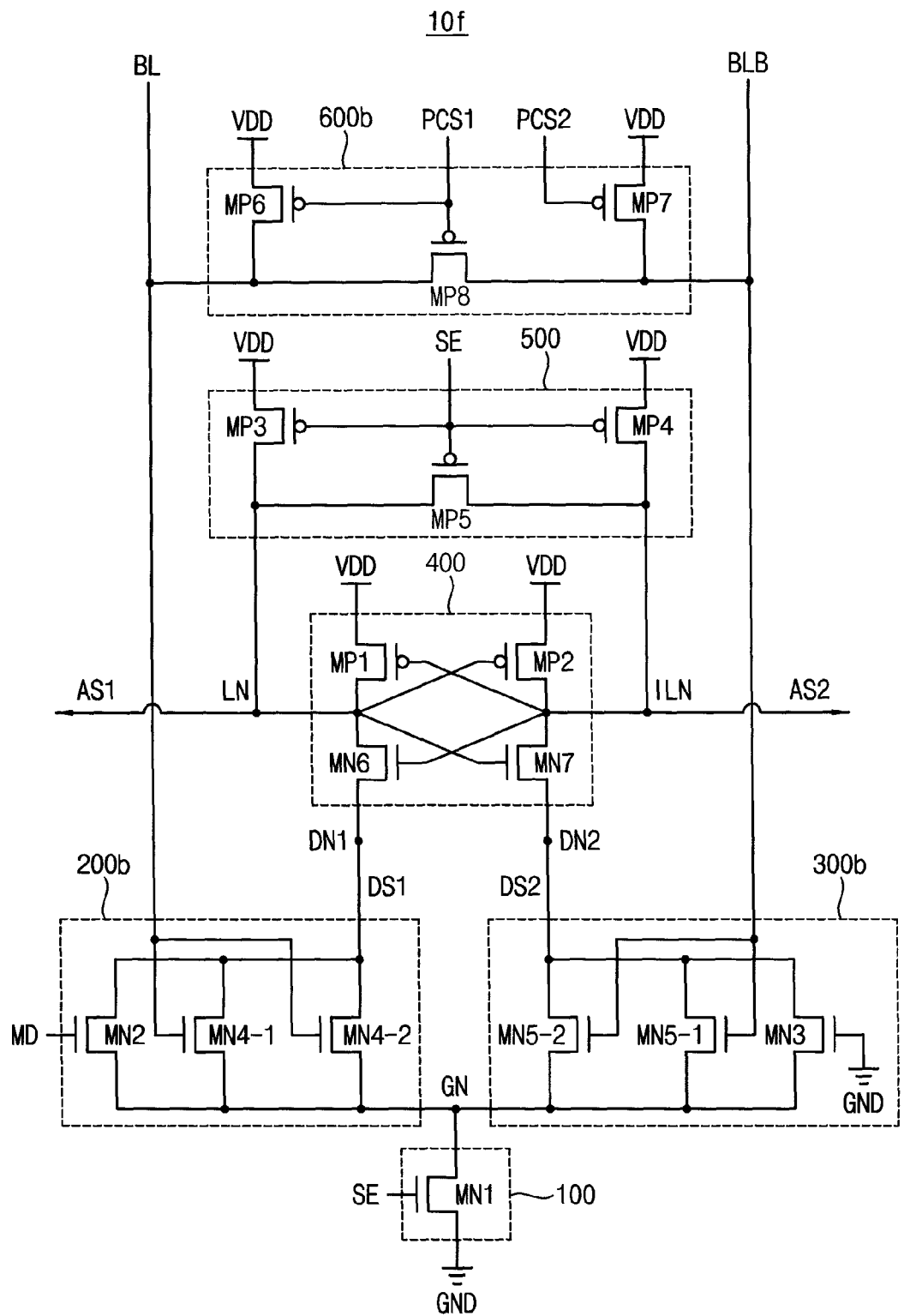
FIG. 7 is a circuit diagram illustrating still another sense amplifier according, to example embodiments.

FIG. 7 is a circuit diagram illustrating still another sense amplifier according to example embodiments.

The sense amplifier 10f in FIG. 7 is similar to the sense amplifier 10d in FIG. 5, but further includes a precharge circuit 600b.

The precharge circuit 600b may precharge the bit-line BL and the complementary BLB to the supply voltage VDD in response to a first precharge signal PCS1 and a second precharge signal PCS2.

Referring to FIG. 7, the precharge circuit 600b may include a sixth PMOS transistor MP6, a seventh PMOS transistor MP7 and an eighth PMOS transistor MP8. The transistors of the precharge circuit 600b may also be referred to as precharge transistors.

The sixth PMOS transistor MP6 may be coupled between the supply voltage VDD and the bit-line BL. The sixth PMOS transistor MP6 may include a gate receiving the first precharge signal PCS1.

The seventh PMOS transistor MP7 may be coupled between the supply voltage VDD and the complementary bit-line BLB. The seventh PMOS transistor MP7 may include a gate receiving the second precharge signal PCS2.

The eighth PMOS transistor MP8 may be coupled between the bit-line BL and the complementary bit-line BLB. The eighth PMOS transistor MP8 may include a gate receiving the first precharge signal PCS1.

In some example embodiments, the first precharge signal PCS1 and the second precharge signal PCS2 may have the same logic level as the sense enable signal SE in the double-ended read mode in which the mode signal MD has the logic, low level.

Therefore, in the double-ended read mode in which the mode signal MD has the logic low level, while the sense enable signal SE has the logic low level to turn off the switching NMOS transistor MN1, the first precharge signal PCS1 and the second precharge signal PCS2 have the logic low level to turn on the sixth PMOS transistor MP6, the seventh PMOS transistor MP7 and the eighth PMOS transistor MP8 included in the precharge circuit 600b such that the bit-line BL and the complementary bit-line BLB may be precharged to the supply voltage VDD.

On the other band, in the double-ended read mode in which the mode signal MD has the logic low level, while the sense enable signal SE has the logic high level to turn on the switching NMOS transistor MN1, the first precharge signal PCS1 and the second precharge signal PCS2 may have the logic high level to turn off the sixth PMOS transistor MP6, the seventh PMOS transistor MP7 and the eighth PMOS transistor MP8 included in the precharge circuit 600b. Therefore, the voltage of the bit-line BL and the voltage of the complementary bit-line BLB may be changed based on data stored in a memory cell coupled to the bit-line BL and the complementary bit-line BLB.

In some example embodiments, the first precharge signal PCS1 may have the same logic level as the sense enable signal SE and the second precharge signal PCS2 may be maintained at the logic low level in the single-ended read mode in which the mode signal MD has the logic high level.

Therefore, in the single-ended read mode in which the mode signal MD has the logic high level, while the sense enable signal SE has the logic low level to turn of the switching NMOS transistor MN1, the first precharge signal PCS1 and the second precharge signal PCS2 may have the logic low level to turn on the sixth PMOS transistor MP6, the seventh PMOS transistor MP7 and the eighth PMOS transistor MP8 included in the precharge circuit 600b such that the bit-line BL and the complementary bit-line BLB may be precharged to the supply voltage VDD.

On the other hand, in the single-ended read mode in which the mode signal MD has the logic high level, while the sense enable signal SE has the logic high level to turn on the switching NMOS transistor MN1, the first precharge signal PCS1 may have the logic high level to turn off the sixth PMOS transistor MP6 and the eighth PMOS transistor MP8 included in the precharge circuit 600b and the second precharge signal PCS2 may be maintained at the logic low level to keep turning on the seventh PMOS transistor MP7. Therefore, while the voltage of the complementary bit-line BLB is maintained at the supply voltage VDD, the voltage of the bit-line BL may be changed based on data stored in a memory cell coupled to the bit-line BL.

FIGS. 8 to 11 are diagrams for describing example operations of the sense amplifier shown in FIG. 7.

Hereinafter, operations of the sense amplifier 10f of FIG. 7 will described with reference to FIGS. 8 to 11.

FIGS. 8 to 11, it is assumed that the mode control NMOS transistor MN2, the balance NMOS transistor MN3, the at least one first NMOS transistor MN4-1 and MN4-2 and the at least one second NMOS transistor MN5-1 and MN5-2 have the same structure and the same size such that the mode control NMOS transistor MN2, the balance NMOS transistor MN3, the at least one first NMOS transistor MN4-1 and MN4-2 and the at least one second NMOS transistor MN5-1 and MN5-2 have the same current driving capability.

Figure 8:
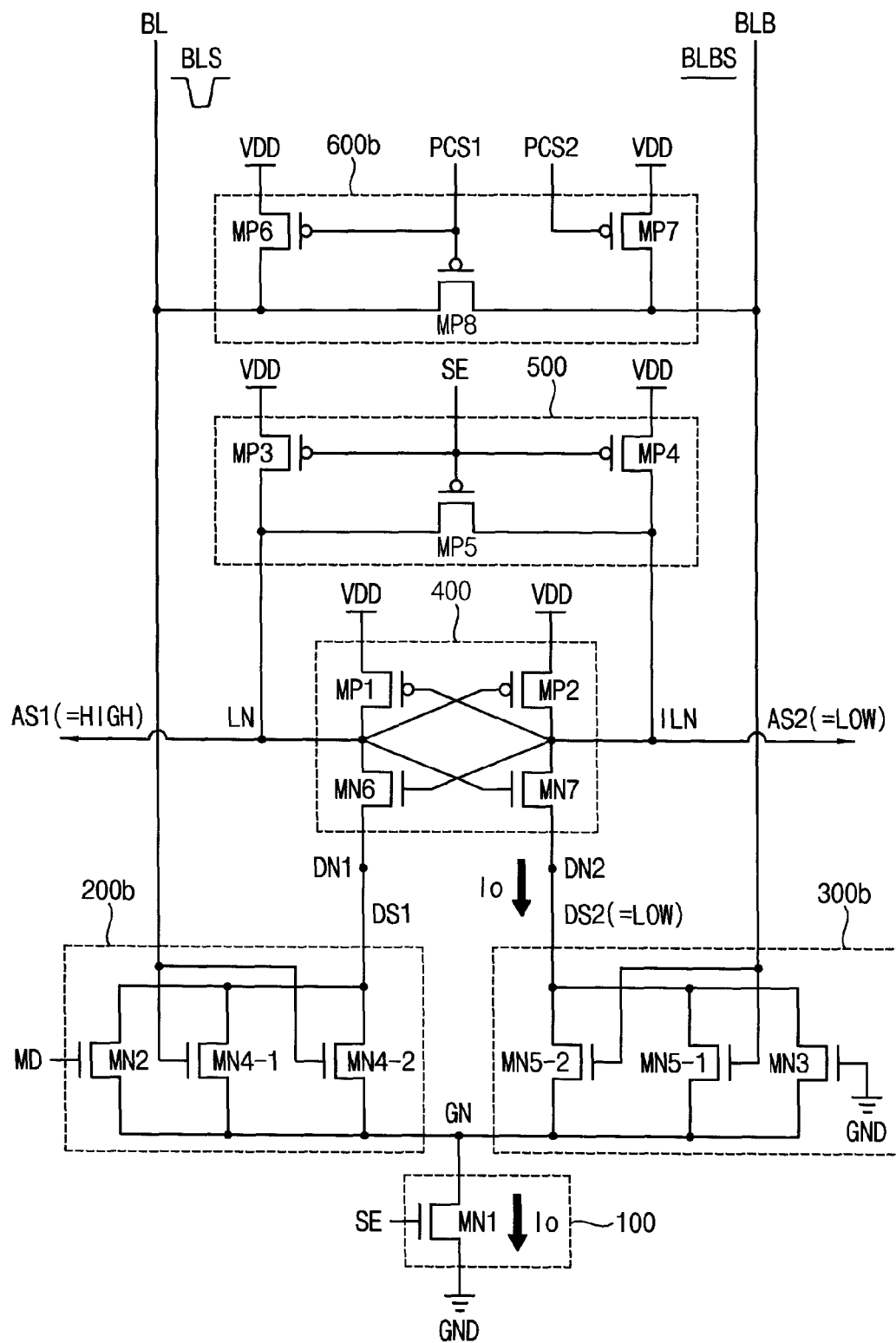
FIGS. 8 to 11 are diagrams for describing exemplary operations of a sense amplifier of FIG. 7.

FIG. 8 is a diagram for describing an operation of the sense amplifier 10f to read data from a memory cell coupled to the sense amplifier 10f when the bit-line signal BLS having the logic low level is provided to the sense amplifier 10f from the memory cell through the bit-line BL and the complementary bit-line signal BLBS having the logic, high level is provided to the sense amplifier 10f from the memory cell through the complementary bit-line BLB in the double-ended read mode.

As described above, since the mode signal MD has the logic low level in the double-ended read mode, the mode control NMOS transistor MN2 may be turned off. In addition, since the ground voltage GND is applied to the gate of the balance NMOS transistor MN3, the balance NMOS transistor MN3 may be turned off. Therefore, the first detection circuit 200b and the second detection circuit 300b may have a symmetric structure with each other.

As described above, while the sense enable signal SE has the logic low level, the reset circuit 500 may reset the voltage, of the latch node LN and the voltage of the complementary latch node ILN to the supply voltage VDD and the precharge circuit 600b may precharge the bit-line BL and the complementary bit-line BLB to the supply voltage VDD.

Subsequently, while the sense enable signal SE has the logic high level, the switching NMOS transistor MN1 may be turned on, and the reset circuit 500 and the precharge circuit 600b may be turned off. At this time, as illustrated in FIG. 8, the bit-line signal BLS having the logic low level may be provided to the sense amplifier 10f from the memory cell through the bit-line BL, and the complementary bit-line signal BLBS having the logic high level may be provided to the sense amplifier 10f from the memory cell through the complementary bit-line BLB.

Since the bit-line signal BLS having the logic low level is provided to the gate of the at least one first NMOS transistor MN4-1 and MN4-2 through the bit-line BL, the at least one first NMOS transistor MN4-1 and MN4-2 may be turned off.

Since the complementary bit-line signal BLBS having the logic high level is provided to the gate of the at least one second NMOS transistor MN5-1 and MN5-2 through the complementary bit-line BLB, the at least one second NMOS transistor MN5-1 and MN5-2 may be turned on.

Therefore, as illustrated in FIG. 8, a sensing current to may flow from the second detection node DN2 to the ground voltage GND through the second detection circuit 300b, the ground node GN and the switching NMOS transistor MN1. Since the mode control NMOS transistor MN2 and the at least one first NMOS transistor MN4-1 and MN4-2 included in the first detection circuit 200b are turned off, a magnitude of a current that flow from the first detection node DN1 to the ground voltage GND through the first detection circuit 200b, the ground node GN and the switching NMOS transistor MN1 may be zero or substantially zero.

Therefore, as illustrated in FIG. 8, the second detection signal DS2, which is generated at the second detection node DN2, may have the logic, low level such that the voltage of the second detection signal DS2 may be lower than the voltage of the first detection signal DS1. As such, the latch circuit 400 may output the first amplified signal AS1 having the logic high level through the latch node LN and output the second amplified signal AS2 having the logic low level through the complementary latch node ILN.

Figure 9:
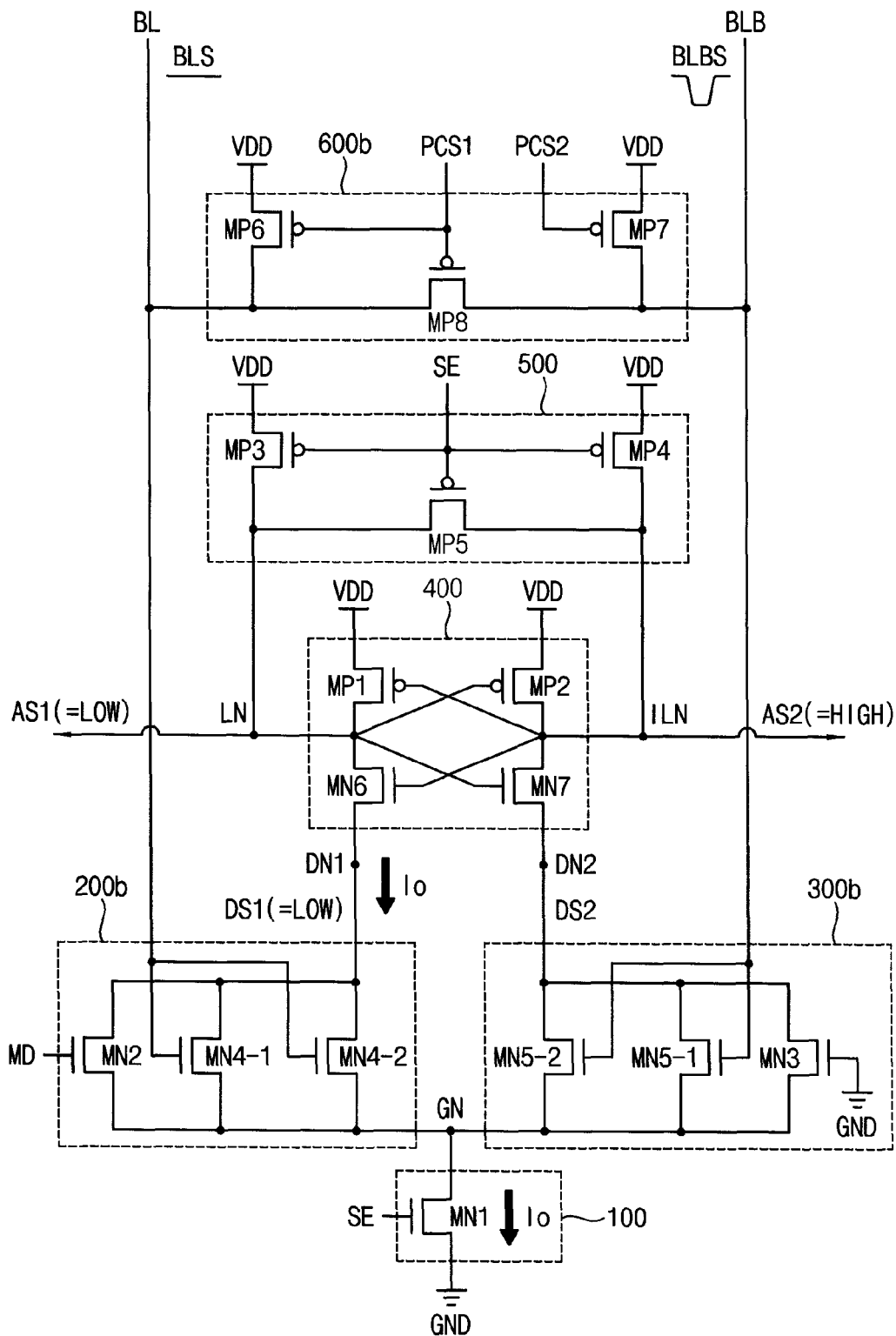

FIG. 9 is a diagram for describing an operation of the sense amplifier 10f to read data from a memory cell coupled to the sense amplifier 10f when the bit-line signal BLS having the logic high level is provided to the sense amplifier 10f from the memory cell through the BL and the complementary bit-line signal BLBS having the logic low level is provided to the sense amplifier 10f from the memory cell through the complementary bit-line BLB in the double-ended read mode.

As described above, since the mode signal MD has the logic low level in the double-ended read mode, the mode control NMOS transistor MN2 may be turned off. In addition, since the ground voltage GND is applied to the gate of the balance NMOS transistor MN3, the balance NMOS transistor MN3 may be turned off. Therefore, the first detection circuit 200b and the second detection circuit 300b may have a symmetric structure with each other.

As described above, while the sense enable signal SE has the logic low level, the reset circuit 500 may reset the voltage of the latch node LN and the voltage of the complementary latch node ILN to the supply voltage VDD and the precharge circuit 600b may precharge the bit-line BL and the complementary bit-line BLB to the supply voltage VDD.

Subsequently, while the sense enable signal SE has the logic high level, the switching NMOS transistor MN1 may be turned on, and the reset circuit 500 and the precharge circuit 600b may be turned off. At this time, as illustrated in FIG. 9, the bit-line signal BLS having the logic high level may be provided to the sense amplifier 10f from the memory cell through the bit-line BL, and the complementary bit-line signal BLBS having the logic low level may be provided to the sense amplifier 10f from the memory cell through the complementary bit-line BLB.

Since the bit-line signal BLS having the logic high level is provided to the gate of the at least one first NMOS transistor MN4-1 and MN4-2 through the bit-line BL, the at least one first NMOS transistor MN4-1 and MN4-2 may be turned on. Since the complementary bit-line signal BLBS having the logic low level is provided to the gate of the at least one second NMOS transistor MN5-1 and MN5-2 through the complementary bit-line BLB, the at least one second NMOS transistor MN5-1 and MN5-2 may be turned off.

Therefore, as illustrated in FIG. 9, the sensing current To may flow from the first detection node DN1 to the ground voltage GND through the first detection circuit 200b, the ground node GN and the switching NMOS transistor MN1. Since the balance NMOS transistor MN3 and the at least one second NMOS transistor MN5-1 and MN5-2 included in the second detection circuit 300b are turned off, a magnitude of a current that flows from the second detection node DN2 to the ground voltage GND through the second detection circuit 300b, the ground node GN and the switching NMOS transistor MN1 may be zero or substantially zero.

Therefore, as illustrated in FIG. 9, the first detection signal DS1, which is generated at the first detection node DN1, may have the logic low level such that the voltage of the first detection signal DS1 may be lower than the voltage of the second detection signal DS2. As such, the latch circuit 400 may output the first amplified signal AS1 having the logic low level through the latch node LN and output the second amplified signal AS2 having the logic high level through the complementary latch node ILN.

Figure 10:
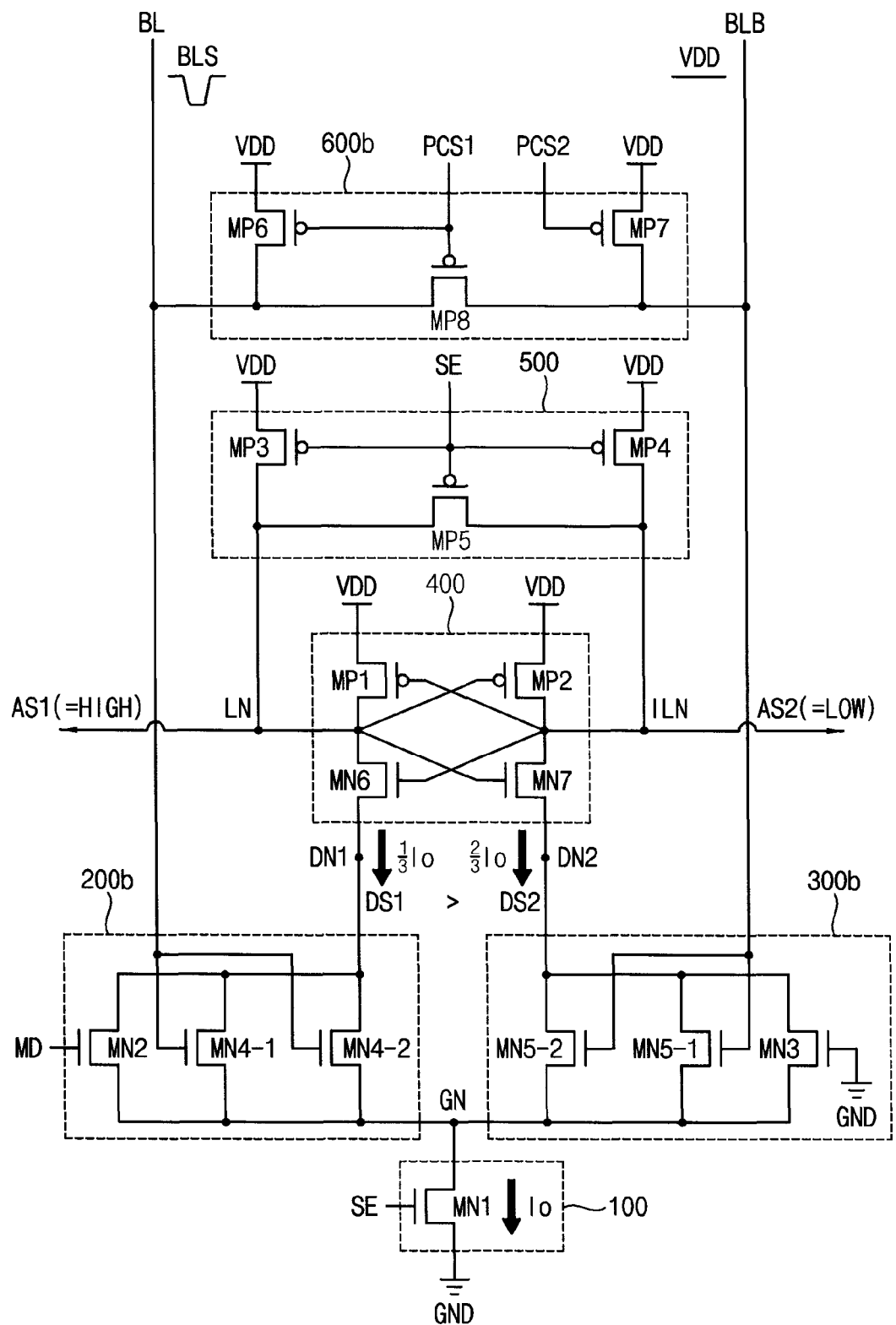

FIG. 10 is a diagram for describing an operation of the sense amplifier 10f to read data from a memory cell coupled to the sense amplifier 10f when the bit-line signal BLS having the logic low level is provided to the sense amplifier 10f from the memory cell through the bit-line BL in the single-ended read mode.

In FIG. 10, the first detection circuit 200b is described to include two first NMOS transistors MN4-1 and MN4-2 and the second detection circuit 300b is described to include two second NMOS transistors MN5-1 and MN5-2 as an example.

As described above, since the mode signal MD has the logic high level in the single-ended read mode, the mode control NMOS transistor MN2 may be turned on. In addition, since the ground voltage GND is applied to the gate of the balance NMOS transistor MN3, the balance NMOS transistor MN3 may be turned off. Therefore, the first detection circuit 200b and the second detection circuit 300b may have an asymmetric structure, with each other.

As described above, while the sense enable signal SE has the logic low level, the reset circuit 500 may reset the voltage of the latch node LN and the voltage of the complementary latch node ILN to the supply voltage VDD and the precharge circuit 600b may precharge the bit-line BL and the complementary bit-line BLB to the supply voltage VDD.

Subsequently, while the Sense enable signal SE has the logic high level, the switching NMOS transistor MN1 may be turned on, and the reset circuit 500 may be turned off. In addition, the sixth PMOS transistor MP6 and the eighth PMOS transistor MP8 included in the precharge circuit 600b may be turned off, and the seventh PMOS transistor MP7 included in the precharge circuit 600b may be maintained to be turned on. Therefore, the voltage of the complementary bit-line BLB may be maintained at the supply voltage VDD. At this time, as illustrated in FIG. 10, the bit-line signal BLS having the logic low level may be provided to the sense amplifier 10f from the memory cell through the bit-line BL.

Since the bit-line signal BLS having the logic low level is provided to the gate of the two first NMOS transistors MN4-1 and MN4-2 through the bit-line BL, the two first NMOS transistors MN4-1 and MN4-2 may be turned off. Since the supply voltage VDD is provided to the gate of the two second NMOS transistors MN5-1 and MN5-2 through the complementary bit-line BLB, the two second NMOS transistors MN5-1 and MN5-2 may be turned on.

As illustrated in FIG. 10, since the mode control NMOS transistor MN2 is turned on in the first detection circuit 200b and the two second NMOS transistors MN5-1, and MN5-2 are turned on in the second detection circuit 300b, a first sensing current $$\frac{1}{3}Io$$

may flow from the first detection node DN1 to the ground node GN through the first detection circuit 200b, a second sensing current $$\frac{2}{3}Io$$

may flow from the second detection node DN2 to the ground node GN through the second detection circuit 300b, and a sensing, current Io, which corresponds to a sum of the first sensing current $$\frac{1}{3}Io$$

and the second sensing current $$\frac{2}{3}Io,$$

may flow front the ground node GN to the ground voltage GND through the switching NMOS transistor MN1.

Since a magnitude of the second sensing current $$\frac{2}{3}Io,$$

which flows through the second detection circuit 300b, is greater than as magnitude of the first sensing current $$\frac{1}{3}Io,$$

which flows through the first detection circuit 200b, the voltage of the second detection signal DS2, which is generated at the second detection node DN2, may be lower than the voltage of the first detection signal DS1, which is generated at the first detection node DN1. Therefore, as illustrated in FIG. 10, the latch circuit 400 may output the first amplified signal AS1 having the logic high level through the latch node LN and output the second amplified signal AS2 having the logic tow level through the complementary latch node ILN.

Figure 11:
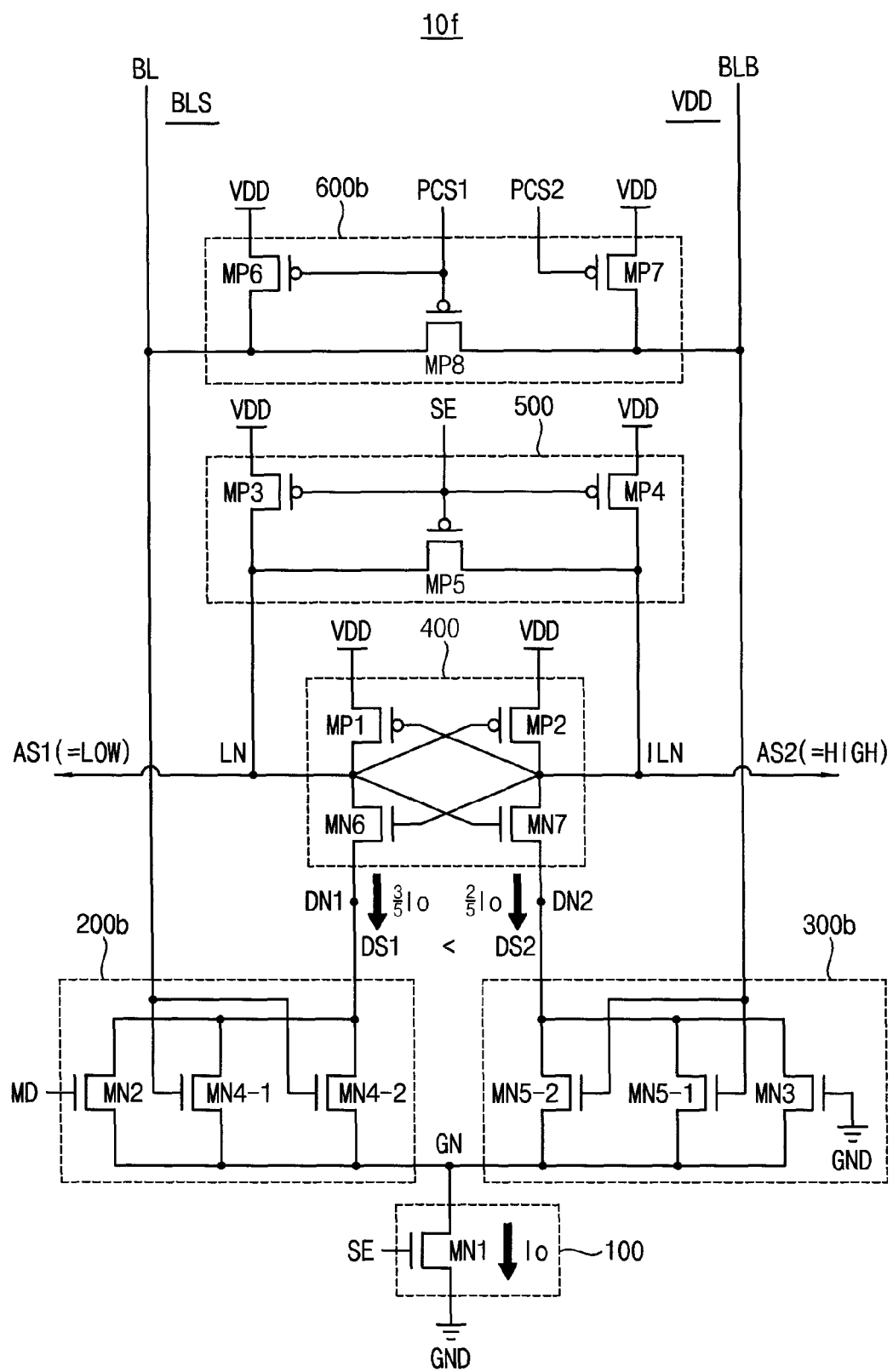

FIG. 11 is a diagram for describing an operation of the sense amplifier 10f to read data from a memory cell coupled to the sense amplifier 10f when the bit-line signal BLS having the logic high level is provided to the sense amplifier 10f from the memory cell through the bit-line BL in the single-ended read mode.

FIG. 11, the first detection circuit 200b is described to include two first NMOS transistors MN4-1 and MN4-2 and the second detection circuit 300b is described to include two second NMOS transistors MN5-1 and MN5-2 as an example.

As described above, since the mode signal MD has the logic high level in the single-ended read mode, the mode control NMOS transistor MN2 may be turned on. In addition, since the ground voltage GND is applied to the gate of the balance NMOS transistor MN3, the balance NMOS transistor MN3 may be turned off. Therefore, the first detection circuit 200b and the second detection circuit 300b may have an asymmetric structure with each other.

As described above, while the sense enable signal SE has the logic low level, the reset circuit 500 may reset the voltage of the latch node LN and the voltage of the complementary latch node ILN to the supply voltage VDD and the precharge circuit 600b may precharge the bit-line BL and the complementary bit-line BLB to the supply voltage VDD.

Subsequently, while the sense enable signal SE has the logic high level, the switching NMOS transistor MN1 may be turned on, and the reset circuit 500 may be turned off. In addition, the sixth PMOS transistor MP6 and the eighth PMOS transistor MP8 included in the precharge circuit 600b may be turned of and the seventh PMOS transistor MP7 included in the precharge circuit 600b may be maintained to be turned on. Therefore, the voltage, of the complementary bit-line BLB may be maintained at the supply voltage VDD. At this time, as illustrated in FIG. 11, the bit-line signal BLS having the logic high level may be provided to the sense amplifier 10f from the memory cell through the bit-line BL.

Since the bit-line signal BLS having the logic high level is provided to the gate of the two first NMOS transistors MN4-1 and MN4-2 through the bit-line BL, the two first NMOS transistors MN4-1 and MN4-2 may be turned on. Since the supply voltage VDD is provided to the gate of the two second NMOS transistors MN5-1 and MN5-2 through the complementary bit-line BLB, the two second NMOS transistors MN5-1 and MN5-2 may be turned on.

As illustrated in FIG. 11, since the mode control NMOS transistor MN2 and the two first NMOS transistors MN4-1 and MN4-2 are turned on in the first detection circuit 200b and the two second NMOS transistors MN5-1 and MN5-2 are turned on in the second detection circuit 300b, a first sensing current $$\frac{3}{5}Io$$

may flow from the first detection node DN1 to the ground node GN through the first detection circuit 200b, a second sensing current $$\frac{2}{5}Io$$

may now from the second detection node DN2 to the ground node GN through the second detection circuit 300b, and a sensing current Io, which corresponds to a sum of the first sensing current $$\frac{3}{5}Io$$

and the second sensing current $$\frac{2}{5}Io,$$

may flow from the ground node GN to the ground voltage GND through the switching NMOS transistor MN1.

Since a magnitude of the first sensing current $$\frac{3}{5}Io,$$

which flows through the first detection circuit 200b, is greater than a magnitude of the second sensing current $$\frac{2}{5}Io,$$

which flows through the second detection circuit 300b, the voltage of the first detection signal DS1, which is generated at the first detection node DN1, may be lower than the voltage of the second detection signal DS2, which is generated at the second detection node DN2. Therefore, as illustrated in FIG. 11, the latch circuit 400 may output the first amplified signal AS1 having the logic low level through the latch node LN and output the second amplified signal AS2 having the logic high level through the complementary latch node ILN.

Figure 12:
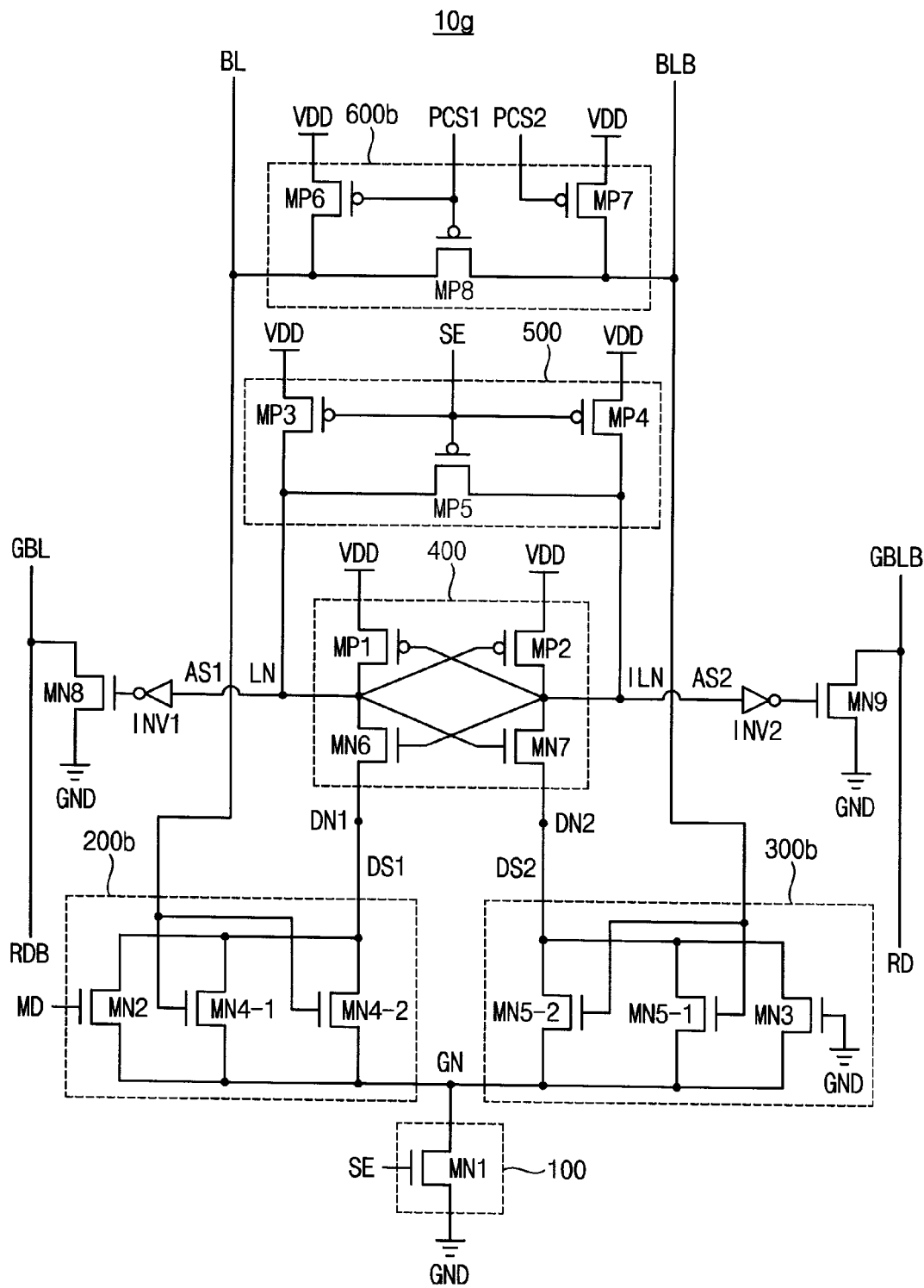
FIG. 12 is a circuit diagram illustrating yet another sense amplifier according to example embodiments.

FIG. 12, is a circuit diagram illustrating still another sense amplifier according to example embodiments.

The sense amplifier 10g in FIG. 12 is similar to the sense amplifier 10f in FIG. 7, but further includes a first inverter INV1, a second inverter INV2 a fifth NMOS transistor MN8 and a sixth NMOS transistor MN9.

The first inverter INV1 may be coupled to the latch node LN to invert the first amplified signal AS1.

The fifth NMOS transistor MN8 may be coupled between a global bit-line GBL and the ground, voltage GND. The fifth NMOS transistor MN8 may include a gate connected to an output electrode of the first inverter INV1.

The second inverter INV2 may be coupled to the complementary latch node ILN to invert the second amplified signal AS2.

The sixth NMOS transistor MN9 may be coupled between a complementary global bit-line GBLB and the ground voltage GND. The sixth NMOS transistor MN9 may include a gate connected to an output electrode of the second inverter INV2.

In some example embodiments, the global bit-line GBL and the complementary global bit-line GBLB may be precharged to the supply voltage VDD.

Therefore, when the first amplified signal AS1 has the logic high level and the second amplified signal AS2 has the logic low level, the fifth NMOS transistor MN8 may be turned of and the sixth NMOS transistor MN9 may be turned on such that the global bit-line GBL may be maintained at the logic high level and the complementary global bit-line GBLB may be changed to the logic low level.

On the other hand, when the first amplified signal AS1 has the logic low level and the second amplified signal AS2 has the logic high level, the fifth NMOS transistor MN8 may be turned on and the sixth NMOS transistor MN9 may be turned off such that the global bit-line GBL may be changed to the logic low level and the complementary global bit-line GBLB may be maintained at the logic high level.

As described above with reference to FIGS. 8 to 11, when the bit-line signal BLS having the logic low level is provided to the sense amplifier 10g through the bit-line BL in the double-ended read mode or in the single-ended read mode, the first amplified signal AS1 may have the logic high level and the second amplified signal AS2 may have the logic low level. Therefore, a read data signal RD having the logic low level, which is the same logic level as the bit-line signal BLS, may be output through the complementary global bit-line GBLB, and a complementary read data signal RDB having the logic high level, which is a different logic, level from the bit-line signal BLS, may be output through the global bit-line GBL.

On the other hand, when the bit-line signal BLS having the logic high level is provided to the sense amplifier 10g through the bit-line BL in the double-ended read mode or in the single-ended read mode, the first amplified signal AS1 may have the logic low level and the second amplified signal AS2 may have the logic high level. Therefore, the read data signal RD having the logic high level, which is the same logic level as the bit-line signal BLS, may be output through the complementary global bit-line GBLB, and the complementary read data signal RDB having the logic low level, which is a different logic level from the bit-line signal BLS, may be output through the global bit-line GBL.

As described above with reference to FIGS. 1 to 12, sense amplifiers according to example embodiments may perform both as double-ended read operation and a single-ended read operation based on the mode signal MD. Therefore, sense amplifiers according to example embodiments may be used in both memory devices performing double-ended read operations and memory devices performing single-ended read operations.

Figure 13:
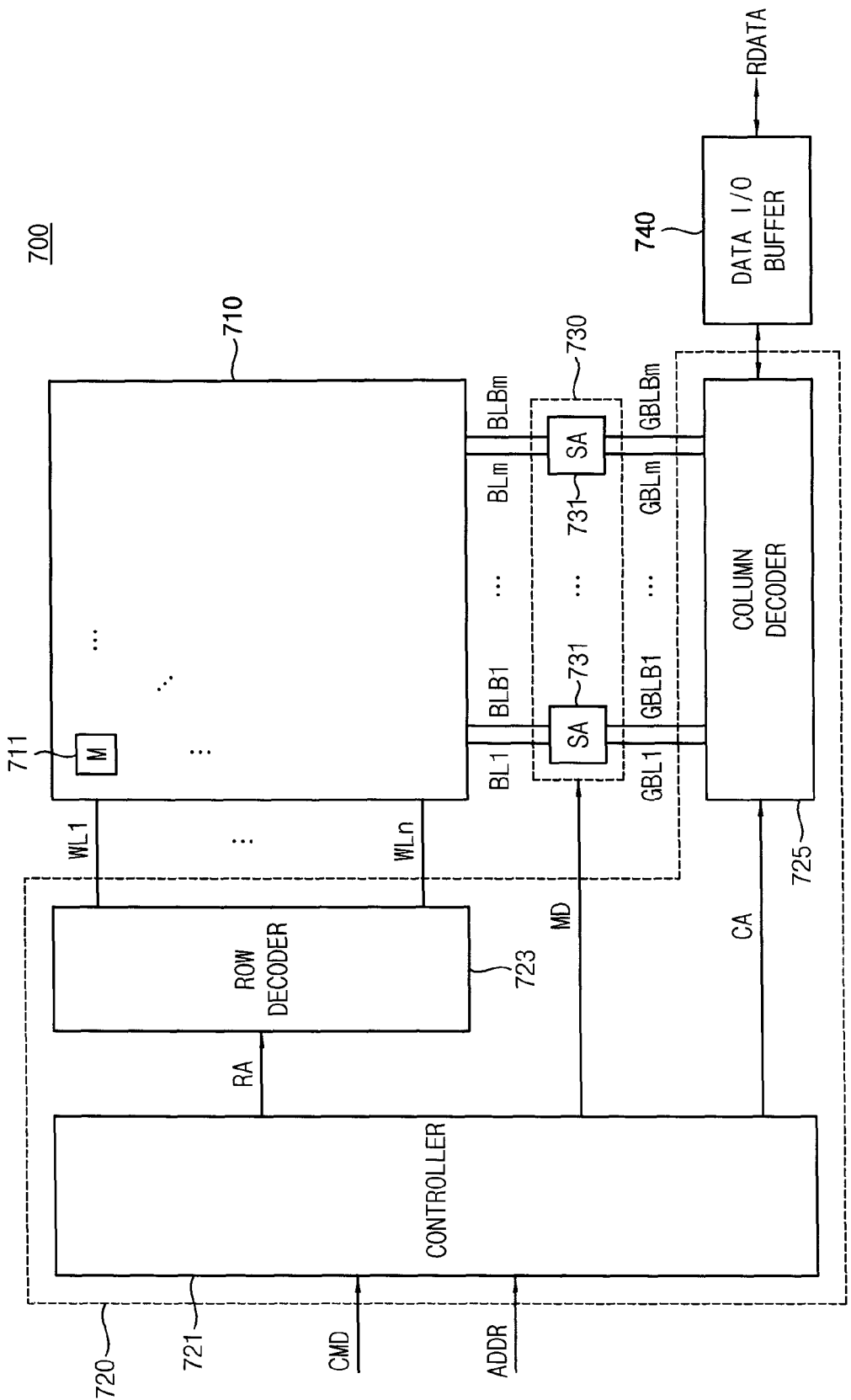
FIG. 13 is a block diagram illustrating a memory device according to example embodiments.

FIG. 13 is a block diagram illustrating a memory device according to example embodiments.

Referring to FIG. 13, a memory device 700 includes: a memory cell array 710 control circuit 720; a sense amplification circuit 730; and a data input/output (I/O) buffer 740.

The memory cell array 710 includes a plurality of memory cells M 711 arranged in rows and columns. The plurality of memory cells 711 are connected to as plurality of word-lines WL1~WLn, a plurality of bit-lines BL1~BLm and a plurality of complementary bit-lines BLB1~BLBm. Here, n and in represent positive integers. Each of the plurality of memory cells 711 may be a static random access memory (SRAM) cell. However, example embodiments should not be limited to this example.

The sense amplification circuit 730 includes a plurality of sense amplifiers SA 731. Each of the sense amplifiers 731 is coupled to a corresponding column of the memory cell array 710 through a corresponding bit-line and a corresponding complementary bit-line. Each of the sense amplifiers 731 generates a read data signal and a complementary read data signal based on a mode signal MD provided from the control unit 720, a voltage of the corresponding bit-line and a voltage of the corresponding complementary bit-line.

The control circuit 720 controls operation of the memory device 700 based on a command signal CMD and an address signal ADDR received from an external device. The control circuit 720 may include: a controller 721; a row decoder 723; and a column decoder 775.

The controller 721 may generate the mode signal MD based on whether the plurality of memory cells 711 perform double-ended read operations or single-ended read operations. For example, the controller 721 may generate the mode signal MD having a logic low level when the plurality of memory cells 711 perform double-ended read operations, and generate the mode signal MD having a logic high level when the plurality of memory cells 711 perform single-ended read operations.

In addition, the controller 721 may generate a row address RA and a column address CA based on the address signal ADDR, provide the row address RA to the row decoder 723, and provide the column address CA to the column decoder 725.

The row decoder 723 may be coupled to the memory cell array 710 through the plurality of word-lines WL1~WLn. The row decoder 723 may decode the row address RA provided from the controller 721 and select one of a plurality of rows included, in the memory cell array 710 by activating one of the plurality of word-lines WL1~WLn corresponding to the row address RA. For example, the row decoder 723 may apply a word-line driving voltage to a word-line, corresponding to the row address RA.

The column decoder 725 may be coupled to the plurality of sense amplifiers 731 through a plurality of global bit-lines GBL1~GBLm and a plurality of complementary global bit-lines GBLB1~GBLBm. The column decoder 725 may decode the column address CA provided from the controller 721, select one of the plurality of global bit-lines GBL1~GBLm and one of the plurality of complementary global bit-lines GBLB1~GBLBm corresponding to the column address CA, generate read data RDATA based on the read data signal and the complementary read data signal received through the selected complementary global bit-line and the selected global bit-line, and provide the read data RDAFA to the data I/O buffer 740.

The data I/O buffer 740 may provide the read data RDATA to an external device.

Figure 14:
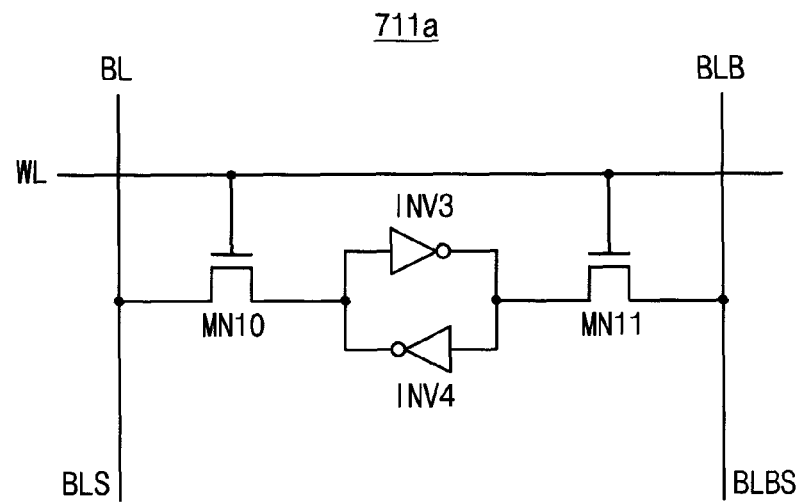
FIG. 14 is a circuit diagram illustrating an example of a memory cell included in as memory device of FIG. 13.

FIG. 14 is a circuit diagram illustrating an example of a memory cell included in memory device of FIG. 13.

Referring to FIG. 14, a memory cell 711a may include: a seventh NMOS transistor MN10; an eighth NMOS transistor MN11; a third inverter INV3; and a fourth inverter INV4.

An output electrode of the third inverter INV3 may be connected to an input electrode of the fourth inverter INV4 and an output electrode of the fourth inverter INV4 may be connected to an input electrode of the third inverter INV3 such that the third inverter INV3 and the fourth inverter INV4 may form a latch circuit.

The seventh NMOS transistor MN10 may be coupled between a bit-line BL and the input electrode of the third inverter INV3. The seventh NMOS transistor MN10 may include a gate connected to a word-line WL.

The eighth NMOS transistor MN11 may be coupled between a complementary bit-line BLB and the input electrode of the fourth inverter INV4. The eighth NMOS transistor MN11 may include a gate connected to the word-line WL.

When the word-line driving voltage is applied to the word-line WL in a read mode, the seventh NMOS transistor MN10 and the eighth NMOS transistor MN11 may be turned on such that the memory cell 711a may output the bit-line signal BLS and the complementary bit-line signal BLBS, which have different logic levels from each other, through the bit-line BL and the complementary bit-line BLB, respectively.

As such, the memory cell 711a of FIG. 14 may perform the double-ended read operation.

The memory cell 711a of FIG. 14 is an example of the memory cell 711 that performs the double-ended read operation. However, example embodiments are not limited thereto. The memory cell 711 may have various alternative structures that perform double-ended read operations.

Figure 15:
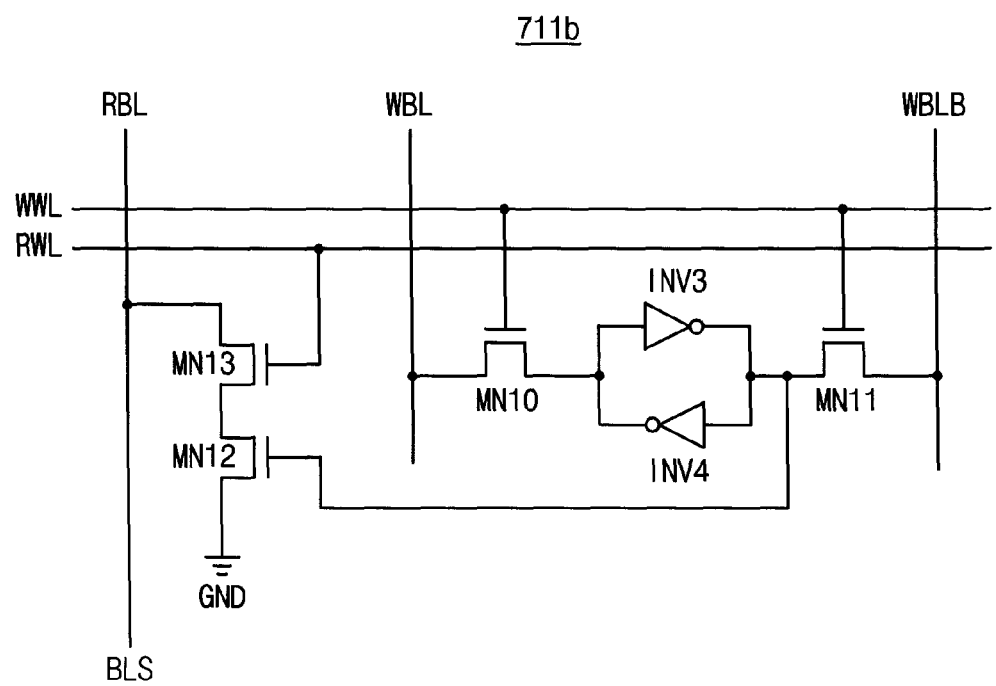
FIG. 15 is a circuit diagram illustrating another example of as memory cell included in a memory device of FIG. 13.

FIG. 15 is a circuit diagram illustrating another example of a memory cell included in a memory device of FIG. 13.

Referring to FIG. 15, a memory cell 711b may include: a seventh NMOS transistor MN10; an eighth NMOS transistor MN11; a third inverter INV3; a fourth inverter INV4; a ninth NMOS transistor MN12; and a tenth NMOS transistor MN13.

An output electrode of the third inverter INV3 may be connected to an input electrode of the fourth inverter INV4 and an output electrode of the fourth inverter INV4 may be connected to an input electrode of the third inverter INV3 such that the third inverter INV3 and the fourth inverter INV4 may form a latch circuit.

The seventh NMOS transistor MN10 may be coupled between a write bit-line WBL and the input electrode of the third inverter INV3. The seventh NMOS transistor MN10 may include a gate connected to a write bit-line WWL.

The eighth NMOS transistor MN11 may be coupled between a write complementary bit-line WBLB and the input electrode of the fourth inverter INV4. The eighth. NMOS transistor MN11 may include a gate connected to the write word-line WWL.

The ninth NMOS transistor MN12 and the tenth NMOS transistor MN13 may be coupled in series between a read bit-line RBL and a ground voltage GND. The ninth NMOS transistor MN12 may include a gate connected to the input electrode of the fourth inverter INV4. The tenth NMOS transistor MN13 may include a gate connected to a read word-line RWL.

When the word-line driving voltage is applied to the read word-line RWL in a read mode, the Memory cell 711b may output the bit-line signal BLS through the read bit-line RBL based on a voltage of the output electrode of the third inverter INV3.

As such, the memory cell 711b of FIG. 15 may perform the single-ended read operation.

The memory cell 711b of FIG. 15 is an example of the memory cell 711 that performs the single-ended read operation. However, example embodiments are not limited thereto. The memory cell 711 may have various alternative structures that perform single-ended read operations.

Referring again to FIG. 13, the controller 721 may generate the mode signal MD having the logic low level when the memory cell array 710 includes the memory cells 711a that perform double-ended read operations, and the controller 721 may generate the mode signal MD having the logic high level when the memory cell array 710 includes the memory cells 711b that perform single-ended read operations.

Each of the sense amplifiers 731 may be implemented with a sense amplifier according to example embodiments. Therefore, when the mode signal MD has the logic low level, each of the sense amplifiers 731 may perform a double-ended read operation on the bit-line signal BLS provided through the bit-line BL and the complementary bit-line signal BLBS provided through the complementary bit-line BLB to generate the read data signal RD and the complementary read data signal RDB. On the other hand, when the mode signal MD has the logic high level, each of the sense amplifiers 731 may perform a single-ended read operation on the bit-line signal BLS provided through the bit-line BL to generate the read data signal RD and the complementary read data signal RDB.

A structure and an operation of sense amplifiers according to example embodiments are described above with reference to FIGS. 1 to 12. Therefore, a detail description of the sense amplifier 731 will be omitted.

Figure 16:
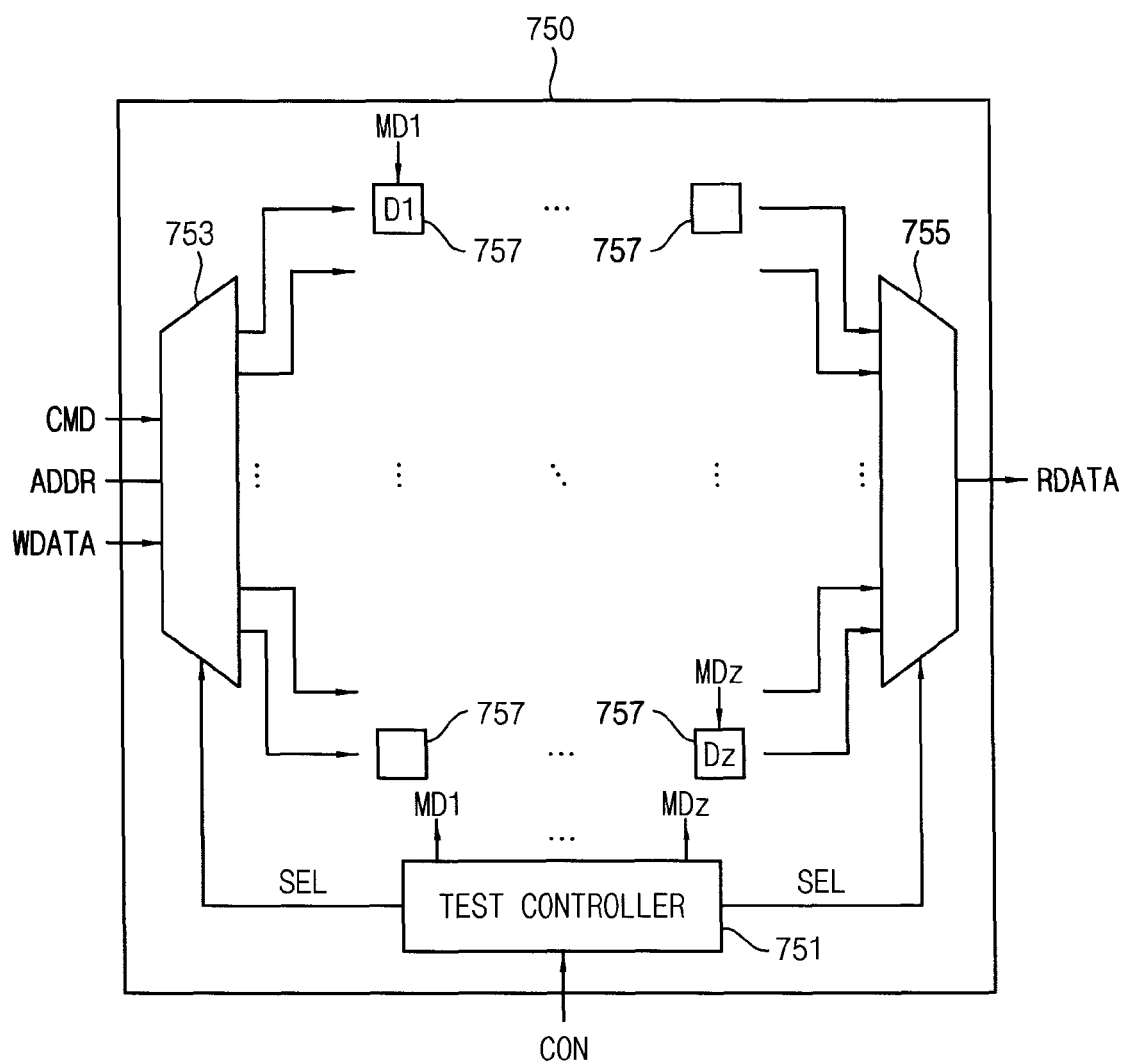
FIG. 16 is a block diagram illustrating a memory test system according to example embodiments.

FIG. 16 is a block diagram illustrating a memory test system according to example embodiments.

Referring to FIG. 16, a memory test system 750 includes: a test controller 751; a demultiplexer 753; a multiplexer 755; and first through z-th memory devices D1~Dz 757. Here, z represents a positive, integer.

Each of the first through z-th memory devices 757 includes one of the memory cell 711a that performs double-ended read operations and the memory cell 711b that performs single-ended read operations.

The test controller 751 performs a test operation on the first through z-th memory devices 757 based on a control signal CON. For example, the test controller 751 may determine whether the first through z-th memory devices 757 operate correctly by repeatedly performing a write operation and a read operation on the first through z-th memory devices 757.

In some example embodiments, the test controller 751 may provide first through z-th mode signals MD1~MDz to the first through z-th memory devices 757, respectively, based on whether the plurality of memory cells 711 included in the first through z-th memory devices 757 perform double-ended read operations or single-ended read operations. For example, the test controller 751 may provide a k-th mode signal MDk having the logic low level to a k-th memory device 757 when the k-th memory device 757 includes the memory cell 711a that performs double-ended read operations, and the test controller 751 may provide the k-th mode signal MDk having the logic high level to the k-th memory device 757 when the k-th memory device 757 includes the memory cell 711b that performs single-ended read operations. Here, k represents a positive integer equal to or smaller than z.

The demultiplexer 753 may receive a command signal CMD, an address signal ADDR and a write data WDATA from an external device, and provide the command signal CMD, the address signal ADDR and the write data WDATA to one of the first through z-th memory devices 757 based on a selection signal SEL provided from the test controller 751.

When the first through z-th memory devices 757 receive the command signal CMD, the address signal ADDR and the write data WDATA from the demultiplexer 753, the first through z-th memory devices 757 may perform the write operation and the read operation based on the first through z-th mode signals MD1~MDz, respectively. Each of the first through z-th memory devices 757 may provide the read data RDATA, which is generated by the read operation, to the multiplexer 755.

The multiplexer 755 may receive the read data RDATA from the first through z-th memory devices 757, select one of the first through z-th memory devices 757 based on the selection signal SEL provided from the test controller 751, and output the read data RDATA provided front the selected memory device.

Each of the first through z-th memory devices 757 may be embodied as the memory device 700 of FIG. 13. A structure and an operation of the memory device 700 of FIG. 13 are described above with reference to FIGS. 1 to 15. Therefore, a detail description of the first through z-th memory devices 757 will be omitted.

As described above with reference to FIGS. 1 to 16, sense amplifiers according to example embodiments may perform both double-ended read operations and single-ended read operations based art the mode signal MD. Therefore, as illustrated in FIG. 16, the plurality of memory devices 757 including sense amplifier(s) may be manufactured to have the same or substantially the same structure, except for a structure of the memory cell 711, and the plurality of memory devices 757 may be tested at the same time (e.g., simultaneously or concurrently) using the memory test system 750. As such, the plurality of memory devices 757 having different types of the memory cells may be tested at the same time (e.g., simultaneously or concurrently).

Figure 17:
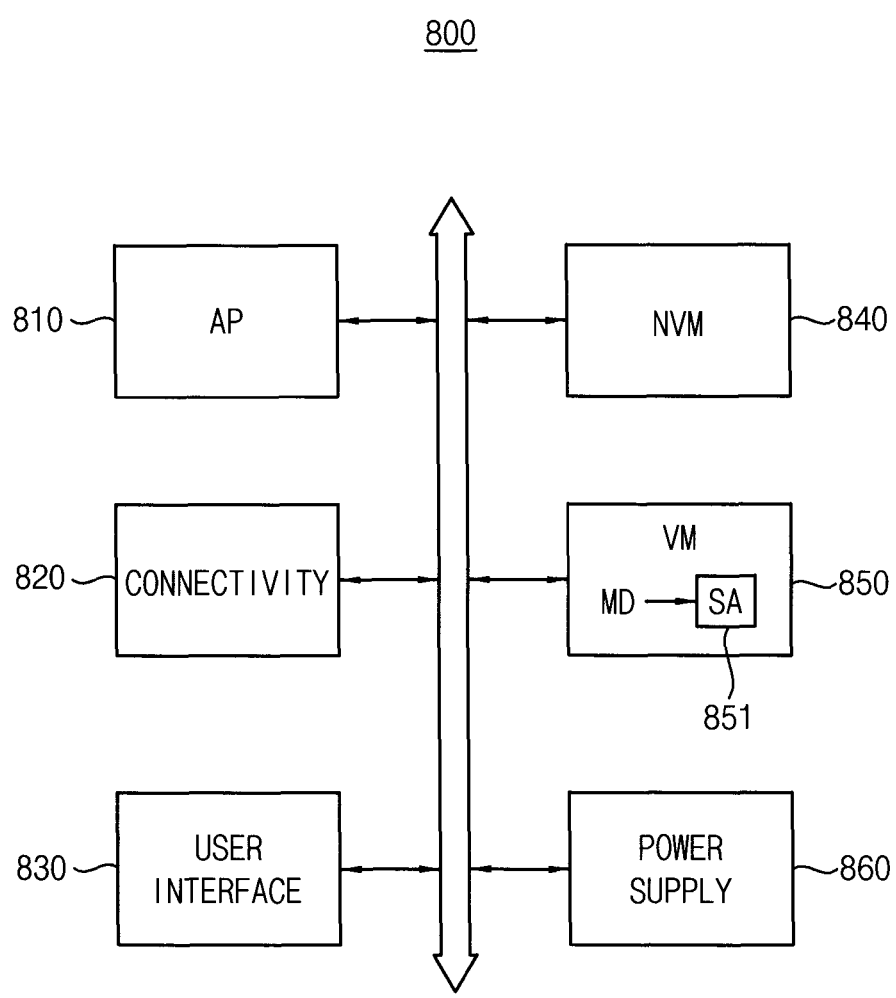
FIG. 17 is a block diagram illustrating a mobile system according to example embodiments.

FIG. 17 is a block diagram illustrating a mobile system according to example embodiments.

Referring to FIG. 17, a mobile system 800 includes: an application processor 810; a connectivity circuit 820; a user interface 830; a nonvolatile memory device NVM 840; a volatile memory device VM 850; and a power supply 860. In some example embodiments, the mobile system 800 may be a mobile phone, a smart phone, a personal digital assistant (PDA), a portable multimedia player (PMP), a digital camera, a music player, a portable game console, a navigation system, etc.

The application processor 810 may execute applications, such as a web browser, a game application, a video player, etc. In some example embodiments, the application processor 810 may include a single core or multiple cores. For example, the application processor 810 may be a multi-core processor, such as a dual-core processor, a quad-core processor, a hexa-core processor, etc. The application processor 810 may include an internal or external cache memory.

The connectivity circuit 820 may perform wired or wireless communication with an external device. For example, the connectivity circuit 820 may perform Ethernet communication, near field communication (NFC), radio frequency identification (RFID) communication, mobile telecommunication, memory card communication, universal serial bus (USB) communication, etc. In some example embodiments, connectivity unit 820 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 850 may store data processed by the application processor 810, or may operate as a working memory. The volatile memory device 850 may include a sense amplifier 851 that performs double-ended read operations and single-ended read operations based on a mode signal MD. The volatile memory device 850 may be embodied as the memory device 700 of FIG. 13. A structure and an operation of the memory device 700 of FIG. 13 are described above with reference to FIGS. 1 to 15. Therefore, a detail description of the volatile memory device 850 will be omitted.

The nonvolatile memory device 840 may store a boot image for booting the mobile system 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 830 may include at least one input device, such as a keypad, a touch screen, etc., and at least one output device, such as a speaker, a display device, etc. The power supply 860 may supply a power supply voltage to the mobile system 800.

In some example embodiments, the mobile system 800 may limber include an image processor and/or a storage device, such as it memory card, a solid state drive (SSD), a hard disk drive (HDD), a CD-ROM, etc.

In some example embodiments, the mobile system 800 and/or components of the mobile system 800 may be packaged in various forms, such as package on package (PoP), bill grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

As discussed herein, one or more components of the mobile system 800 may be hardware, firmware, hardware executing software or any combination thereof. When the one or more components of the mobile system 800 are hardware, such hardware may include one or more Central Processing circuits (CPUs), system-on-chips (SOCs), digital signal processors (DSPs), application-specific-integrated-circuits (ASICs), field programmable gate arrays (FPGAs) computers or the like configured as special purpose machines to perform the functions of the one or more components of the mobile system 800. CPUs, SOCs, DSPs, ASICs and FPGAs may sometimes generally be referred to as processors and/or microprocessors.

Figure 18:
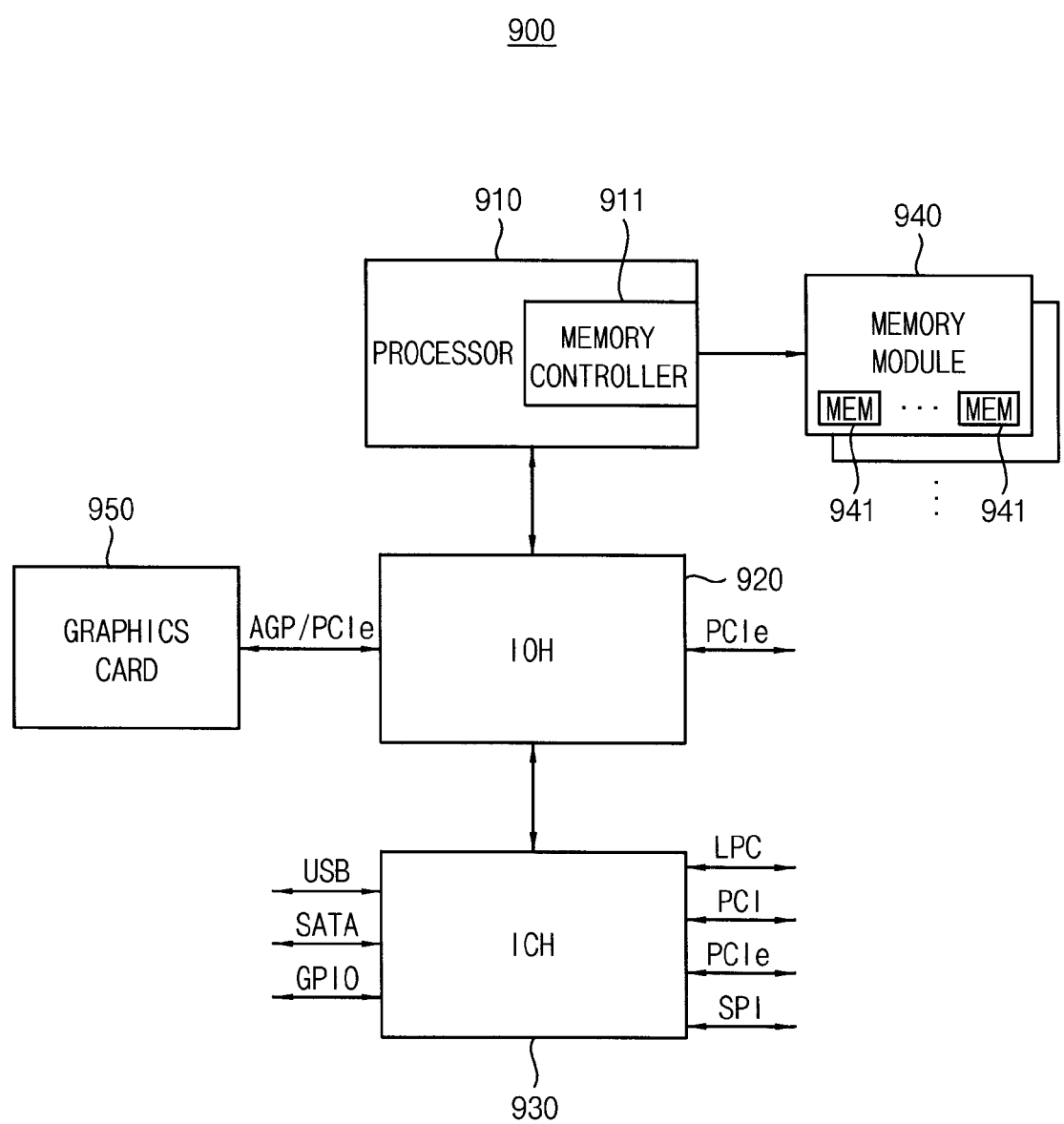
FIG. 18 is a block diagram illustrating a computing system according to example embodiments.

FIG. 18 is a block diagram illustrating a computing system according to example embodiments.

Referring to FIG. 18, a computing system 900 includes: a processor 910; an input/output hub (IOH) 920; an input/output controller hub (ICH) 930; at least one memory module 940; and a graphics card 950. In some example embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 910 may perform various computing functions, such as executing specific software for performing specific calculations or tasks. For example, the processor 910 may be a microprocessor, a central process unit (CPU), a digital signal processor, or the like. In some example embodiments, the processor 910 may include a single core or multiple cores. For example, the processor 910 may be a multi-core processor, such as a dual-core processor, a quad-core processor, a hexa-core processor, etc. Although FIG. 16 illustrates the computing system 900 including one processor 910, in some example embodiments, the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some example embodiments, the memory controller 911 may be located inside the input/output hub 920. The input/output hub 920 including the memory controller 911 may be referred to as memory controller hub (MCH).

The memory module 940 may include as plurality of memory devices MEM 941. The memory device 941 may include a sense amplifier that performs double-ended road operations and single-ended read operations based on a mode signal. The memory device 941 may be embodied as the memory device 700 of FIG. 13. A structure and an operation of the memory device 700 of FIG. 13 are described above with reference to FIGS. 1 to 15. Therefore, as detail description of the memory device 941 will be omitted.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, to HyperTransport, a lightning data transport (LDT), a QuickPath interconnect (QPI), a common system interface (CSI), etc. The input/output hub 920 may provide various interfaces with the devices. For example, the input/output hub 920 may provide an accelerated graphics port (AGP) interface, a peripheral component interface-express (PCIe), a communications streaming architecture (CSA) interface, etc. Although FIG. 18 illustrates the computing system 900 including one input/output hub 920. In some example embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some example embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller but (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a huh interface, an enterprise Southbridge interface (ESI), PCIe, etc.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some example embodiments, the processor 910, the input/output hub 920 and the input/output controller hub 930 may be implemented as separate chipsets or separate integrated circuits. In other example embodiments, at least two of the processor 910, the input/output hub 920 and the input/output controller hub 930 may be implemented as a single chipset.

One or more components of the computing system 901 (e.g., the memory controller, etc.) may be hardware, firmware, hardware executing software or any combination thereof. When the one or more components of the computing system 900 are hardware, such hardware may include one or more Central Processing circuits (CPUs), system-on-chips (SOCs), digital signal processors (DSPs), application-specific-integrated-circuits (ASICs), field programmable gate arrays (FPGAs) computers or the like configured as special purpose machines to perform the functions of the one or more components of the computing, system 900. CPUs, SOCs, DSPs, ASICs and FPGAs may sometimes generally be referred to as processors and/or microprocessors.

The foregoing is illustrative of inventive, concepts and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A sense amplifier, comprising:
a switching transistor configured to apply a ground voltage to a ground node in response to a sense enable signal;
a first detection circuit coupled between the ground node and a first detection node, the first detection circuit being configured to provide a first detection signal to the first detection node based on a mode signal and a voltage of a bit-line;
a second detection circuit coupled between the ground node and a second detection node, the second detection circuit being configured to provide a second detection signal to the second detection node based on a voltage of a complementary bit-line;
a latch circuit connected to a supply voltage, the first detection node and the second detection node, the latch circuit being configured to,
generate a first amplified signal and a second amplified signal based on the first and second detection signals,
output the first amplified signal through a latch node, and
output the second amplified signal through a complementary latch node; and
wherein the mode signal has a first logic level in a double-ended read mode, and has a second logic level in a single-ended read mode, the first logic level being different from the second logic level.

2. The sense amplifier of claim 1, wherein:
the first detection circuit includes,
a mode control transistor coupled between the ground node and the first detection node, the mode control transistor having a gate configured to receive the mode signal, and
at least one first transistor coupled between the ground node and the first detection node, the at least one first transistor having a gate connected to the bit-line; and
the second detection circuit includes,
a balance transistor coupled between the ground node and the second detection node, the balance transistor having a gate configured to receive the ground voltage, and
at least one second transistor coupled between the ground node and the second detection node, the at least one second transistor having a gate connected to the complementary bit-line.

3. The sense amplifier of claim 2, wherein a current driving capability of the mode control transistor is the same or substantially the same as a current driving capability of the balance transistor.

4. The sense amplifier of claim 2, wherein a sum of a current driving capability of the at least one first transistor is the same or substantially the same as a sum of a current driving capability of the at least one second transistor.

5. The sense amplifier of claim 2, wherein a number of the at least one first transistors is the same as a number of the at least one second transistors.

6. The sense amplifier of claim 1, wherein:
in the double-ended read mode, the first detection circuit is configured to receive a bit-line signal through the bit-line and the second detection circuit is configured to receive a complementary bit-line signal through the complementary bit-line; and
in the single-ended read mode, the first detection circuit is configured to receive the bit-line signal through the bit-line and the second detection circuit is configured to receive the supply voltage through the complementary bit-line.

7. The sense amplifier of claim 1, wherein the latch circuit comprises:
a first latch transistor coupled between the supply voltage and the latch node, the first latch transistor having a gate connected to the complementary latch node;
a second latch transistor coupled between the supply voltage and the complementary latch node, the second latch transistor having a gate connected to the latch node;
a third latch transistor coupled between the latch node and the first detection node, the third latch transistor having a gate connected to the complementary latch node; and
a fourth latch transistor coupled between the complementary latch node and the second detection node, the fourth latch transistor including a gate connected to the latch node.

8. The sense amplifier of claim 1, further comprising:
a reset circuit configured to reset a voltage of the latch node and a voltage of the complementary latch node to the supply voltage in response to the sense enable signal.

9. The sense amplifier of claim 8, wherein the reset circuit comprises:
a first reset transistor coupled between the supply voltage and the latch node, the first reset transistor having a gate configured to receive the sense enable signal;
a second reset transistor coupled between the supply voltage and the complementary latch node, the second reset transistor having a gate configured to receive the sense enable signal; and
a third reset transistor coupled between the latch node and the complementary latch node, the third reset transistor having a gate configured to receive the sense enable signal.

10. The sense amplifier of claim 1, further comprising:
a precharge circuit configured to precharge the bit-line and the complementary bit-line to the supply voltage in response to a first precharge signal and a second precharge signal.

11. The sense amplifier of claim 10, wherein the precharge circuit comprises:
a first precharge transistor coupled between the supply voltage and the bit-line, the first precharge transistor having a gate configured to receive the first precharge signal;
a second precharge transistor coupled between the supply voltage and the complementary bit-line, the second precharge transistor having a gate configured to receive the second precharge signal; and
a third precharge transistor coupled between the bit-line and the complementary bit-line, the third precharge transistor having a gate configured to receive the first precharge signal.

12. The sense amplifier of claim 11, wherein:
the first precharge signal and the second precharge signal have a same logic level as the sense enable signal when the mode signal has a first logic level;
the first precharge signal has a same logic level as the sense enable signal and the second precharge signal is maintained at the first logic level when the mode signal has a second logic level; and the first logic level is different from the second logic level.

13. The sense amplifier of claim 1, further comprising:

a first inverter configured to invert the first amplified signal;

a first transistor coupled between a global bit-line and the ground voltage, the first transistor having a gate connected to an output electrode of the first inverter;

a second inverter configured to invert the second amplified signal; and a second transistor coupled between a global complementary bit-line and the ground voltage, the second transistor having a gate connected to an output electrode of the second inverter.

14. A memory device, comprising:

a memory cell array including a plurality of memory cells arranged in rows and columns, the plurality of memory cells being connected to a plurality of word-lines, a plurality of bit-lines and a plurality of complementary bit-lines;

a plurality of sense amplifiers, each of the plurality of sense amplifiers being coupled to a corresponding column of the memory cell array through a corresponding bit-line and a corresponding complementary bit-line, and each of the plurality of sense amplifiers being configured to generate a first amplified signal and a second amplified signal based on a mode signal, a voltage of the corresponding bit-line and a voltage of the corresponding complementary bit-line;

a control circuit configured to generate the mode signal based on whether the plurality of memory cells are configured to perform a double-ended read operation or a single-ended read operation; and wherein each of the plurality of sense amplifiers includes, a switching transistor configured to apply a ground voltage to a ground node in response to a sense enable signal, a first detection circuit coupled between the ground node and a first detection node, the first detection circuit being configured to provide a first detection signal to the first detection node based on the mode signal and the voltage of the corresponding bit-line, a second detection circuit coupled between the ground node and a second detection node, the second detection circuit being configured to provide a second detection signal to the second detection node based on the voltage of the corresponding complementary bit-line, and a latch circuit connected to a supply voltage, the first detection node and the second detection node, the latch circuit being configured to output the first amplified signal and the second amplified signal through a latch node and a complementary latch node, respectively, based on the first detection signal and the second detection signal.

15. A memory device comprising:

a memory cell; and a sense amplifier coupled to the memory cell, the sense amplifier being configured to perform a single-ended read operation for the memory cell in a single-ended read mode, and to perform a double-ended read operation for the memory cell in a double-ended read mode; wherein the sense amplifier is configured to operate in the single-ended read mode or the double-ended read mode based on a mode signal from a control circuit, the sense amplifier is configured to have one of a symmetric and asymmetric structure based on a read mode for the memory cell, the read mode being one of the double-ended read mode and the single-ended read mode, and the sense amplifier has the symmetric structure when configured to operate in the double-ended read mode, and the sense amplifier has the asymmetric structure when configured to operate in the single-ended read mode.

16. The memory device of claim 15, wherein:

the memory cell is coupled to a bit-line and a complementary bit line; and the sense amplifier includes, a first detection circuit configured to generate a first detection signal based on the mode signal and a voltage on the bit-line, a second detection circuit configured to generate a second detection signal based on a voltage on the complementary bit-line, and a latch circuit configured to output a first amplified signal and a second amplified signal based on the first and second detection signals, wherein the first detection circuit and the second detection circuit are configured to have one of the symmetric and asymmetric structure relative to one another based on the read mode for the memory cell.

* * * * *